(12) United States Patent
Walczak et al.

(10) Patent No.: US 12,429,506 B1
(45) Date of Patent: Sep. 30, 2025

(54) DEVICE TYPE DETECTION

(71) Applicant: Amazon Technologies, Inc., Seattle, WA (US)

(72) Inventors: Krzysztof Marcin Walczak, Sammamish, WA (US); Sujan Kumar Gonugondla, Bridgewater, NJ (US); Niranjini Rajagopal, Seattle, WA (US); Cameron Dean Whitehouse, Seattle, WA (US); Venkatesh Rao, Bellevue, WA (US); Bharathan Balaji, Seattle, WA (US); Karan Aggarwal, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 528 days.

(21) Appl. No.: 17/545,943

(22) Filed: Dec. 8, 2021

(51) Int. Cl.
*G01R 23/165* (2006.01)
*G01R 19/25* (2006.01)

(52) U.S. Cl.
CPC ....... *G01R 23/165* (2013.01); *G01R 19/2513* (2013.01)

(58) Field of Classification Search
CPC .......................... G01R 23/165; G01R 19/2513
See application file for complete search history.

(56) References Cited

U.S. PATENT DOCUMENTS

| | | | | |
|---|---|---|---|---|
| 8,334,784 | B2* | 12/2012 | Patel | G01R 21/006 |
| | | | | 340/657 |
| 8,638,087 | B2* | 1/2014 | Elberbaum | G01R 19/00 |
| | | | | 324/110 |
| 9,470,551 | B2 | 10/2016 | Ramakrishnan et al. | |
| 9,547,026 | B1* | 1/2017 | Chraim | G01R 21/002 |
| 11,927,609 | B2 | 3/2024 | Song et al. | |
| 2013/0138651 | A1* | 5/2013 | Lu | G06N 3/088 |
| | | | | 707/E17.046 |
| 2013/0158908 | A1* | 6/2013 | Ramakrishnan | G01D 4/002 |
| | | | | 702/60 |
| 2016/0239010 | A1* | 8/2016 | McDaniel | H02J 13/00002 |
| 2018/0306609 | A1* | 10/2018 | Agarwal | G06N 20/10 |
| 2018/0306839 | A1* | 10/2018 | Donnal | G01R 21/133 |
| 2019/0170792 | A1* | 6/2019 | Lorek | G01R 21/002 |
| 2024/0178667 | A1 | 5/2024 | Pankova et al. | |

\* cited by examiner

*Primary Examiner* — Tung S Lau
(74) *Attorney, Agent, or Firm* — Athorus, PLLC

(57) ABSTRACT

Disclosed implementations determine transient distortions, amplitude distortions, and/or periodic distortions present in a voltage signal measured from an electrical circuit at a location and use those distortions to determine a device type of a device operating on the electrical circuit at the location. In some examples, the voltage signal may be filtered into a plurality of sub-bands and one or more two-dimensional representations generated based on transient distortions, amplitude distortions, and/or periodic distortions determined in each sub-band. The one or more 2D representations may be provided to a deep neural network to determine a device type that generated the distortions on the electrical circuit.

20 Claims, 24 Drawing Sheets

DEVICE TYPE DETECTION

BACKGROUND

There are two basic approaches to device monitoring, such as in-home appliance monitoring: intrusive monitoring and non-intrusive monitoring. In the intrusive case, current sensors are placed into the mains connection of appliances. Although this approach results in high accuracy of appliance state detection, it is not cost effective and not every appliance can be easily instrumented with a current sensor. Non-intrusive monitoring relies on single-point measurements and typically uses low frequency current and voltage measurements. However, measurements from existing systems typically require new instrumentation that must be installed into the electrical circuit at the location by an electrician.

BRIEF DESCRIPTION OF DRAWINGS

The detailed description is described with reference to the accompanying figures.

DETAILED DESCRIPTION

Figure 1:
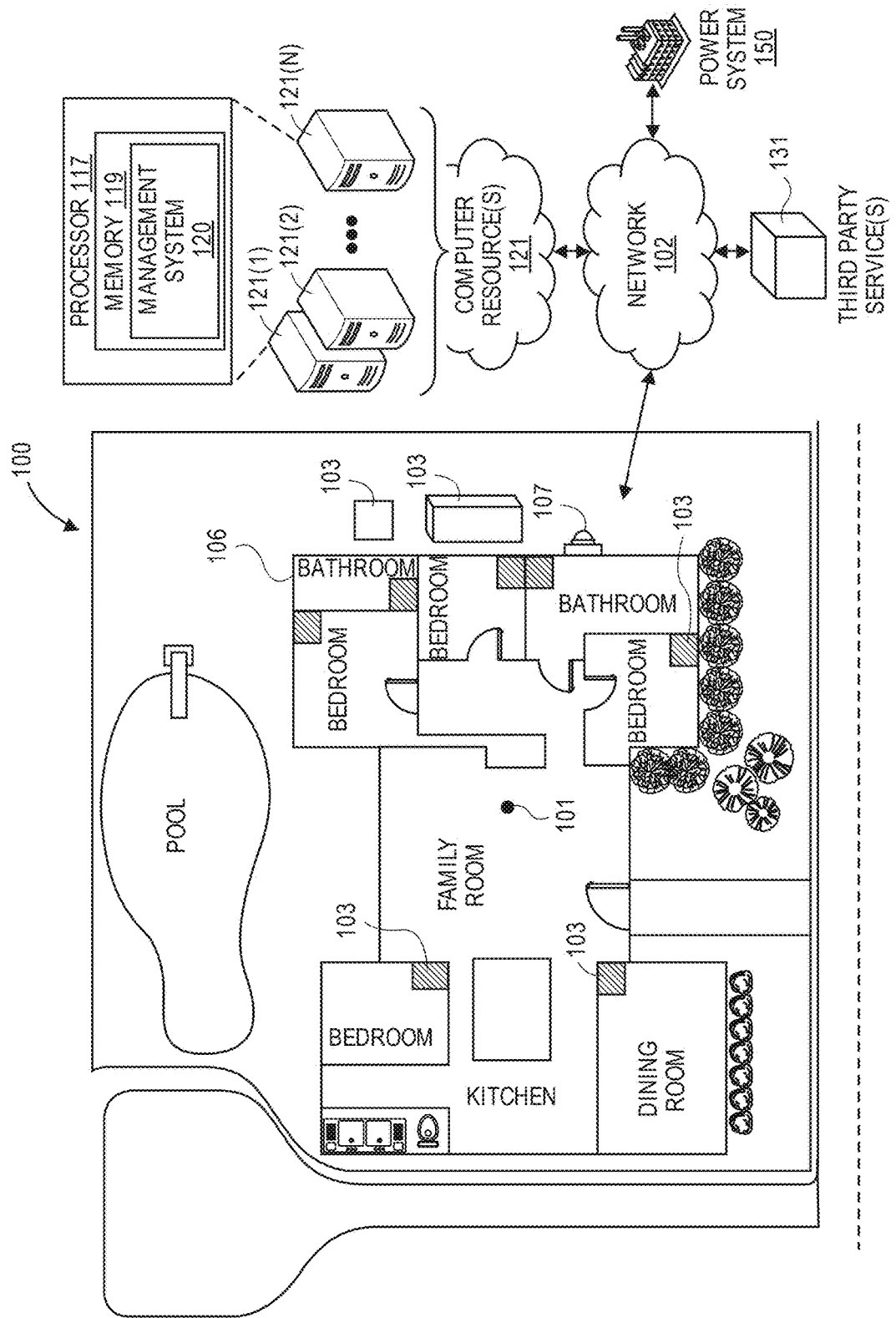
FIG. 1 is a block diagram of a location for which energy consumption is to be monitored and device operations determined, in accordance with disclosed implementations.

Described are systems, methods, and apparatus that monitor parameters, such as potential voltage, current, acoustics, weather, presence, etc., at a location to determine device type and device operational state of devices at the location. For example, when a device at the location is turned on, the device generates voltage that is introduced into the voltage signal at the location and detectable by, for example, a plug-in sensor. Different devices generate different patterns or signatures as they operate, also referred to herein as signature data, thereby making the signatures unique, or almost unique, to different device types and/or different devices. For example, the voltage pattern over a period of time (signature data) introduced by operation of a microwave is very different than the voltage pattern of a washing machine. By monitoring for signature data in the voltage and changes in amplitude, operation of devices at the location can be determined.

In some implementations, device information from multiple devices, other information about the location, presence, or absence of humans at the location, etc., may also be utilized to increase the accuracy in device type determination and/or device operation determination at the location. For example, if new signature data is detected on the electrical circuit of the location, it is determined that the washing machine has recently stopped operation, and there is a human present at the location, that information may be collectively used together to determine that the newly detected signature data corresponds to operation of a dryer at the location.

In some implementations, signature data determined by the plug-in sensor, along with the start time and stop time corresponding to each detected signature and respective state of the device, is provided to a remote computing system, referred to herein as a management system. The management system maintains location profiles for each location and may also receive third party data, such as energy consumption information for the location, weather patterns, device signals, etc. The location profiles may identify characteristics about each location, identification of devices at the location, signature data for those devices and/or different states for those devices, the size of a structure at the location, identification of users that occupy the location, the orientation of the location, the altitude of the location, etc.

In some implementations, the management system may process the signature data to identify the device and/or the device state of a device that generated the signature data. In other implementations, device identification may be done by the plug-in sensor. In still other implementations, the plug-in sensor may maintain deep neural networks ("DNN") trained for previously identified devices at the location and, if a DNN determines device operation based on signature data, the plug-in sensor may identify the device and/or the device state of the device. However, if a trained DNN at the plug-in sensor does not determine the device or operation of a known device type, the detected signature and/or the measured voltage signal may be transmitted from the plug-in sensor to the remote management system for additional analysis. The remote management system may compare the received signature data with a larger data set and/or additional DNNs trained for other device types to determine the device type corresponding to the signature data. Once identified, the trained DNN for the identified device, the device identification, and/or device state identification may be provided to the plug-in sensor and used in the future by the plug-in sensor to identify the device and/or the device state.

FIG. 1 is a block diagram of a location 100 for which device type and operational state are to be determined and monitored, in accordance with disclosed implementations. In this example, the location is a home location that includes a structure 106 in the form of a personal residence. It will be appreciated that the location and corresponding structure may be any location or structure. For example, the location may be residential, business, commercial, public, etc. Likewise, the structure may be a personal residence, apartment, office building, government building, municipal building, entertainment facility (e.g., coliseum, stadium), shopping facility, etc.

One or more plug-in sensors 101 may be positioned at the location by simply plugging in the plug-in sensor into any electrical outlet at the location 100. In some implementations, two plug-in sensors 101 may be utilized at the location, one monitoring each phase of a two-phase power supply at the location. In other implementations, only a single plug-in sensor may be utilized. Additional details about an example plug-in sensor are discussed further below with respect to FIG. 19. Likewise, each location includes one or more devices 103 that consume variable amounts of energy based on their usage. The devices 103 may be internal or inside the structure 106, or external or outside the structure 106, and may provide various functions. In some implementations, the devices 103 may be configured to communicate with a communication component to either receive operation instructions and/or to provide usage information.

As discussed herein, upon installation, the plug-in sensor 101 monitors parameters on the electrical circuit of the location. For example, the plug-in sensor 101 may monitor for voltage changes at the location and extract from a baseline voltage for the location, detected voltage changes, as discussed further below. For example, a location in the United States may receive 120 volts at 60 Hertz ("Hz") frequency, which represents a baseline that is known for the plug-in sensor 101. As discussed further below, the plug-in sensor 101 may then monitor for transient distortions and/or amplitude distortions on the electrical circuit and utilize that information to determine a device type and/or device operational state.

A "transient distortion," as used herein, occurs when an electrical load first turns on and creates an inrush current on an electrical circuit at a location that can be many times higher than the steady state current during operation of that device. As discussed further below, transient distortions can be detected as an impulse response in the voltage that lasts for only a short time. Many devices at a location, such as large appliances (dishwasher, washer, dryer, refrigerator, microwave, oven, etc.), exhibit predictable component sequencing patterns as the device cycles through different stages of operation. For example, a clothes washer has distinct stages of fill, wash, and high-speed spin. An oven turns on the heating elements during pre-heat and then cycles those elements quickly to maintain temperature. While transient distortions occur on short time scales from ten microseconds to one second, component sequencing patterns occur over longer periods of time from one second to forty-eight hours. Accordingly, signature data, as used herein, may include transient distortions that are produced by the device as part of the component sequencing of the device, thereby creating a unique or nearly unique signature for the operation of the device.

As signature data is collected by the plug-in sensor 101, the signature data may be used by the plug-in sensor to identify a device 103 that generated the signature data and/or to determine the state of the device that generated the signature data, as discussed below. In addition, or as an alternative thereto, the signature data may be provided to the management system 120 via a network 102, such as the Internet.

The system may also include computing resource(s) 121. The computing resource(s) 121 are remote from the location 100. Likewise, the computing resource(s) 121 may be configured to communicate over a network 102 with the location 100, the plug-in sensor 101, and/or the devices 103. Likewise, the computing resource(s) 121 may communicate over the network 102 with one or more power systems 150, and/or one or more third party service(s) 131.

As illustrated, the computing resource(s) 121 may be implemented as one or more servers 121(1), 121(2), . . . , 121(N) and may, in some instances, form a portion of a network-accessible computing platform implemented as a computing infrastructure of processors, storage, software, data access, and so forth that is maintained and accessible by components/devices of the system via a network 102, such as an intranet (e.g., local area network), the Internet, etc. The computing resources 121 may process signature data received from the plug-in sensor 101, data from third parties 131 and/or data from the power system 150 to determine devices in operation at the location and/or energy consumed by those devices when operating at the location 100.

The server system(s) 121 does not require end-user knowledge of the physical location and configuration of the system that delivers the services. Common expressions associated for these remote computing resource(s) 121 include "on-demand computing," "software as a service (SaaS)," "platform computing," "network-accessible platform," "cloud services," "data centers," and so forth. Each of the servers 121(1)-(N) include a processor 117 and memory 119, which may store or otherwise have access to a management system 120, as described herein.

The network 102, and each of the other networks discussed herein, may utilize wired technologies (e.g., wires, USB, fiber optic cable, etc.), wireless technologies (e.g., radio frequency, infrared, NFC, cellular, satellite, Bluetooth, etc.), or other connection technologies. The network 102 is representative of any type of communication network, including data and/or voice network, and may be implemented using wired infrastructure (e.g., cable, CAT6, fiber optic cable, etc.), a wireless infrastructure (e.g., RF, cellular, microwave, satellite, Bluetooth, etc.), and/or other connection technologies.

Figure 2:
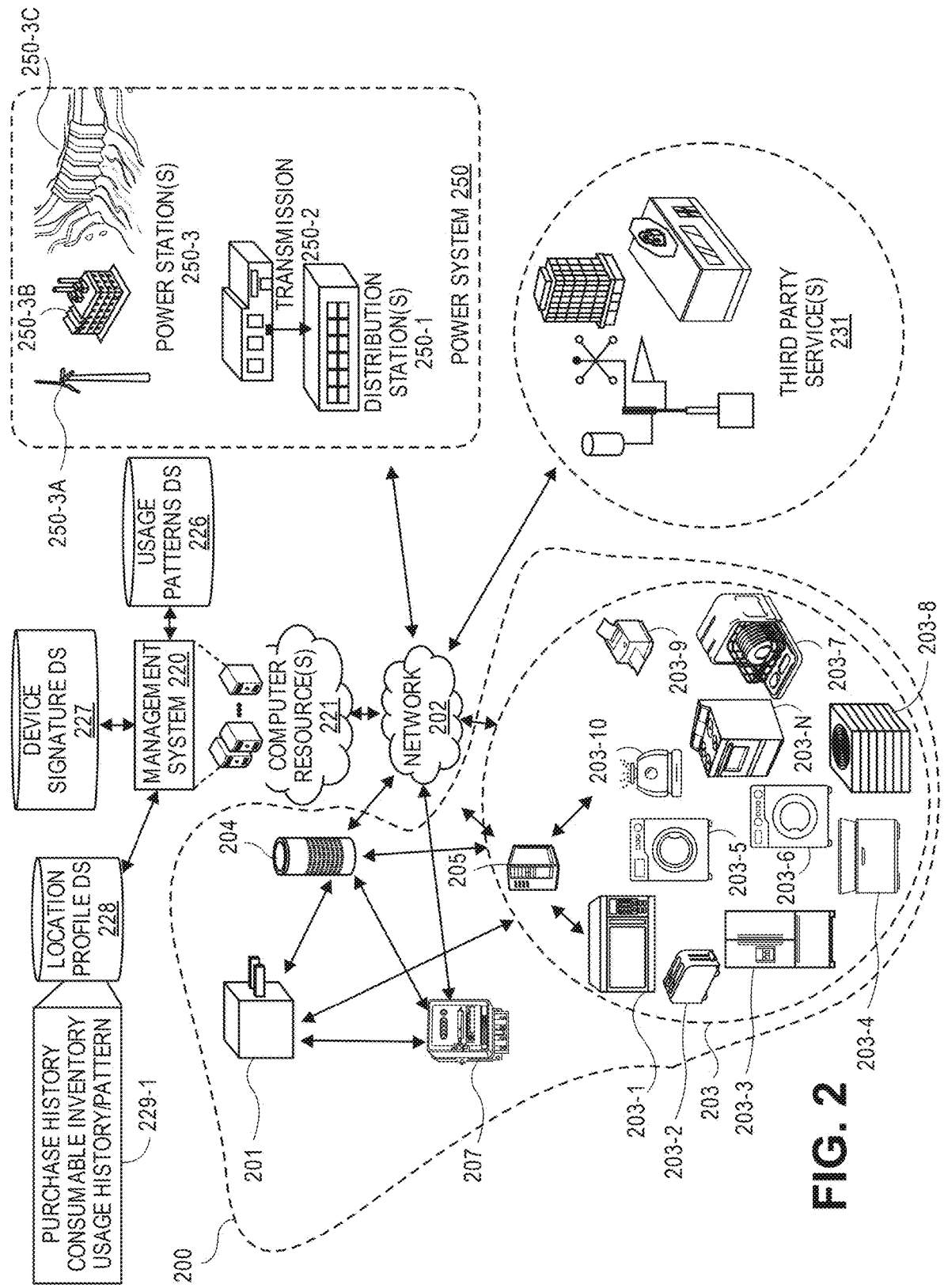
FIG. 2 illustrates a plug-in sensor and devices of the location illustrated in FIG. 1 and the communication paths with remote systems and services, in accordance with disclosed implementations.

FIG. 2 illustrates additional details of a plug-in sensor 201, devices 203, third party systems 231, and the power system 250 illustrated in FIG. 1 and the communication paths therebetween, in accordance with disclosed implementations. Example hardware configurations of the plug-in sensor 201 are discussed further below with respect to FIG. 19. In some implementations, the plug-in sensor 201 may be a stand-alone device that may be plugged into any electrical outlet at the location 200 and used to detect device operation of any other device at the location that is plugged into any other electrical outlet at the location. In other examples, the plug-in sensor 201 may be incorporated into a device 203 and/or included as part of a communication component 204.

The plug-in sensor 201 may by powered by the electrical system at the location 200, by battery power, and/or powered from other devices or components. For example, the plug-in sensor 201 may harvest power from the electrical outlet into which it is installed.

In addition to collecting signature data, the plug-in sensor 201 may be configured to communicate with devices 203, a power meter 207 at the location 200, and/or a communication component 204 that is also positioned within the location. For example, the plug-in sensor 201 may include a wireless transmitter/receiver that is operable to connect to a wireless network 202 and provide determined signature data to other devices and/or the communication component via the wireless network. In other implementations, the plug-in sensor 201 may be configured to transmit data, such as detected signature data, start time and/or stop time of device state changes, and/or device identifiers, to other components, such as the communication component 204 via the electrical circuit at the location.

Any form of wired and/or wireless communication may be utilized to facilitate communication between the devices and/or sensors. For example, any one or more of 802.15.4 (ZIGBEE), 802.11 (WI-FI), 802.16 (WiMAX), BLUETOOTH, Z-WAVE, near field communication ("NFC"), etc., may be used to communicate between the devices and one or more sensors.

Devices 203 at a location may include any one or more items that consume energy during operation. Examples of devices include, but are not limited to microwaves 203-1, toasters 203-2, refrigerators 203-3, freezers 203-4, washing machines 203-5, dryers 203-6, dishwashers 203-7, HVACs 203-8, printers 203-9, coffee makers 203-10, etc. 203-N. In some implementations, the devices may be connected devices capable of receiving instructions, referred to herein as command data, from the management system 220, via a communication hub 205, via the communication component 204, and/or directly. In other implementations, one or more devices may not be connected and may only be controllable by either a user at the location and/or by controlling the circuit that provides power to the device.

Connected devices 203 are configured to receive and execute instructions included in command data sent from the management system 220 operating on a remote computing resource directly, via the hub 205 that is positioned at the location, and/or via the communication component that is positioned at the location. Likewise, in some implementations, the devices 203 may be further configured to transmit or send operational information (e.g., energy consumption, errors, etc.) to the management system, the plug-in sensor, and/or the communication component 204.

In some implementations, the communication hub 205 may forward signature data received from the plug-in sensor 201 to the management system 220 for processing by the management system 220 and/or forward command data received from the management system 220 to various devices 203 for execution. In other implementations, some, or all of the processing of the signature data may be performed by the communication hub 205. For example, the communication hub 205 may receive signature data from the plug-in sensor 201 and process the signature data in an effort to determine device type and/or device operational state of a device that generated the signature data. In other implementations, the communication hub 205 may receive voltage data from the plug-in sensor 201, process the data to determine the signature data, and then utilize the signature data to determine the operating device and/or the state of the operating device. In still other examples, voltage data may be sent to the remote management system 220 and the remote management system may process the voltage data to determine the signature data, devices, device state, etc.

While the described implementation discusses a communication hub 205 and a communication component 204 as distinct components, in some implementations, the operation and functions described herein may be performed entirely by one or both of the communication hub 205 or the communication component 204. Accordingly, the use of the terms communication hub 205 and communication component 204 may, in some implementations, be utilized interchangeably.

Regardless of whether signature data is determined at the plug-in sensor 201, the communication hub 205, the remote computing system 221, and/or some combination thereof, based on the determined parameters, such as signature data determined from the electrical circuit, a device type, a specific device, and/or a device state of a device may be identified. For example, as discussed further below, the plug-in sensor 201 and/or the communication hub 205 at the location 200 may maintain, in a memory, one or more DNNs that are trained to determine from signature data the operational state of one or more devices 203 at the location 200. When signature data is generated from voltage data by the plug-in sensor 201, the plug-in sensor and/or communication hub 205 may process the signature data using the one or more DNNs to determine which device(s) is/are operating at the location 200 and the operational state of that/those device(s). If a match is found, the plug-in sensor 201 may transmit to the communication hub 205 and/or the remote management system 220, a device identifier for the device or device type and/or a device state identifier for a state of the device, along with a start time and a stop time of the device state, indicating a start and stop or change in state of the device 203, as determined from the signature data detected in the voltage data. Device state may be any state or detectable change in a device. A device may have two states (on and off) or multiple states. For example, a microwave may have multiple states, including, standby, on, activation of the rotatable table, energizing of the magnetron, different power levels, and off.

In comparison, if the signature data is not usable by a trained DNN to determine operational state of a device known to be at the location, the signature data may be sent to the management system 220 for additional analysis. As will be appreciated, the management system 220 may comprise additional compute capacity as well as additional DNNs trained for other devices/device types that may be used to determine the device type and operational state of the device that generated the signature data.

Signature data that is used to train DNNs, as discussed herein, may be generated, or obtained from a variety of sources. For example, device manufacturers may provide device signature data for devices and/or device states of devices. In other implementations, as devices and/or device states are identified at different locations, those device signature data may be aggregated, combined, or added to a device signature data store and used in training DNNs for device detection/operational state determination. For example, there may be some signature variation between multiple instances of the same type of device or the same device state of multiple devices of the same device type. As the devices and/or device states are determined at locations, the range of that variation may be updated and used to train, or update a trained DNN, to detect the device type and/or operational state, regardless of variation. Accordingly, as additional devices, device states, and/or instances of devices/device states are identified at different locations, those signatures may be included in the signature data store 227, and/or used to train or update the training of DNNs, thereby increasing the management system's 220 ability to identify devices/device states at different locations and to determine if those devices are operating within an expected range, as indicated by the device signature data detected for the device or a device state of that device.

When the management system 220 receives signature data, it may first process the signature data with one or more DNNs to determine a device type and operational state of the device that generated the signature data. In some implementations, upon determination of the device, device type, and/or device state, the management system may send to the communication hub at the location, and/or to the plug-in sensor, an identification of the newly identified device, device type, and/or device state along with the DNN trained with respect to that device type.

In some implementations, additional information from other devices 203 at the location 200 may also be utilized by the communication hub 205 and/or the management system 220 to determine the device. For example, information received from one or more connected devices 203 may be used to limit or identify candidate devices that are known to be operating and/or to remove from consideration devices that are known to not be operating. Likewise, sensors at the location 200 may be used to assist in device determination. For example, a light or motion sensor may provide data indicating whether a person is moving in areas of the location and/or whether lights are on/off within areas of the location. As another example, image data and/or other information, such as device identification of a device in the possession of a person, may be used to identify a person at the location. Such information, referred to herein as supplemental information, may be used to expand or reduce the list of candidate devices that may be operating and generating the detected signal.

In some implementations, third party systems 231 may also provide data, such as weather data, device data, expected energy consumption for devices, device signature data, etc., to the management system 220. Third party systems include any type of system or service that is independent of the location 200 that provides data that may be used by the management system 220 to determine a device type and/or operational state of a device at the location. For example, the third-party system 231 may be a device manufacturer that provides expected energy consumption information for devices and/or signature data for devices. In such an example, the management system 220 may utilize the expected energy consumption information for a device to determine if that specific device is operating as expected and/or whether replacement of an existing device with a different device of the same device type will save energy.

The power system 250 may also communicate with the management system 220 and provide, for example, energy consumption information for the location 200, demanded power information, or load on the power system, forecasted power demands, costs per unit of power under different operational constraints, etc. For example, the power system 250 may provide information to the management system 220 indicating which power stations are currently operating, the cost per unit of energy produced, and the current load on the power station, also referred to herein as load value. Alternatively, or in addition thereto, energy consumption for a specific location may be provided by a device at the location, such as the power meter 207.

A power system 250 typically includes one or more power station(s) 250-3, transmission station(s) 250-2, and distribution station(s) 250-1. Locations, such as location 200 create demand for power provided by the power system 250 and pay for that power.

Power stations 250-3 may include any form of power generation. For example, a power station 250-3 may be a wind-based power station 250-3A, such as a wind farm, a fossil-fuel based power station 250-3B, a hydroelectric power station 250-3C, a solar power station, a nuclear power station, etc. The power system 250 may include any number and type of power stations 250-3.

Electric-power generated by the power stations 250-3 is bulk transmitted at high-voltages via a series of transmission 250-2 lines and stations from the generating power stations 250-3 to distribution stations 250-1. Transmission 250-2 lines and stations when interconnected with each other create transmission networks, which are often referred to as "power grids." The United States has three major power grids, the Western Interconnection, the Eastern Interconnection and the Electric Reliability Council of Texas (ERCOT) grid, often referred to as the Western Grid, the Eastern Grid and the Texas Grid.

The distribution stations 250-1 are located near the locations 200 that create the demand for the power. The distribution stations 250-1 receive the bulk transmissions, step down the voltage, and distribute the electricity to end locations 200, such as residential housing, businesses, commercial buildings, etc.

A few of the major constraints with power systems is that power within the system must run at the same frequency and, with only a few exceptions, electrical energy cannot be stored. As such, power must be generated and supplied in real-time at a rate that matches demand. If the demand for power exceeds supply, additional power stations 250-3 must be activated to fulfill the additional demand, or brownouts or blackouts may be experienced at numerous locations that rely upon that power. The distribution stations typically bill the locations for the consumption of energy as a measure of kilowatt-hours (kWh), which is a measure of energy. The rate per kWh generally varies based on the current power demand or load of the power system and/or based on the average or expected power demand on the power system. As the power demand on the power system 250 increases, the cost per unit of energy consumed by each location likewise typically increases.

Figure 3:
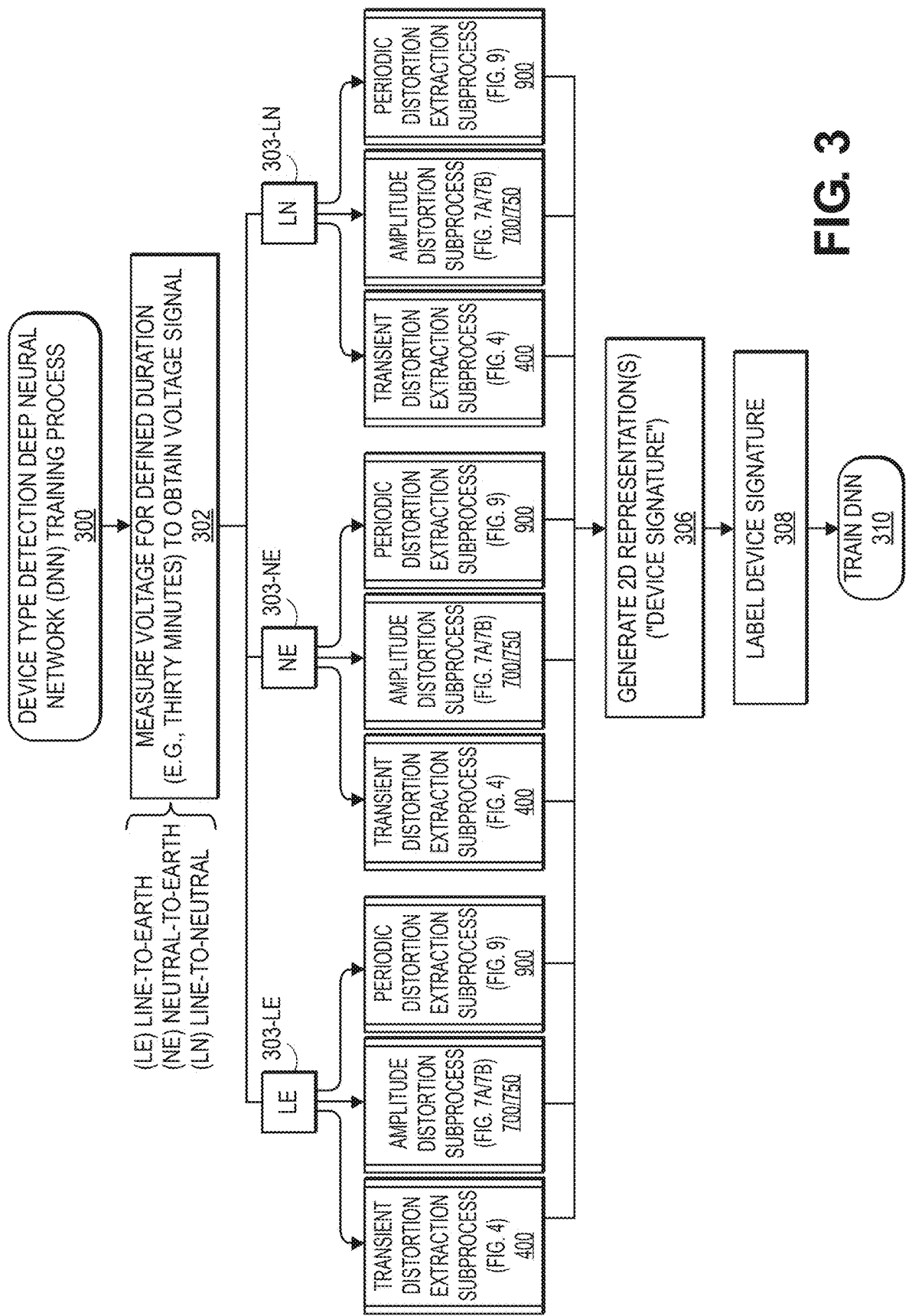
FIG. 3 is an example device type detection deep neural network training process, in accordance with disclosed implementations.

FIG. 3 is an example device type detection deep neural network training process 300, in accordance with disclosed implementations.

The example process begins by measuring a voltage on an electrical circuit for a defined duration, such as thirty minutes, to obtain a voltage signal, as in 302. The defined duration may be different for different devices. For example, many devices have a sequencing pattern that is less than thirty minutes. For devices with a sequencing pattern that is longer than thirty minutes, the defined duration may be longer. Likewise, for devices with shorter sequencing patterns, the defined duration may be shorter. In addition, as illustrated, in some implementations, the voltage may be measured across different combinations of wires of the electrical circuit. For example, a first voltage signal having the defined duration may be measured across the line-to-earth ("LE") lines 303-LE, a second voltage signal may be measured across the neutral-to-earth ("NE") lines 303-NE, and a third voltage signal may be measured across the line-to-neutral ("LN") lines 303-LN. In other implementations, the voltage signal may only be measured across the LE lines 303-LE and the NE lines 303-NE.

For each measured voltage signal 303-LE, 303-NE, and 303-LN, the voltage signal may be processed using one or more of the transient distortion extraction subprocess 400, as discussed below with respect to FIG. 4, the amplitude distortion process 700/750, as discussed below with respect to FIGS. 7A and 7B, and/or the periodic distortion extraction subprocess 900, as discussed below with respect to FIG. 9. As discussed further below, transient distortions may be determined through background subtraction performed on each voltage signal in multiple frequency sub-band. For example, each voltage signal may be divided into multiple sub-bands, such as 30 Hz, 50 Hz, 60 Hz, etc., and background subtraction performed on each sub-band to determine transient distortions in the voltage signals.

Amplitude distortion may be extracted from the voltage signals with root mean square ("RMS") operations, as discussed further below. Periodic distortions may be extracted from the voltage signals by converting the voltage signals between the spectral domain and the cepstral domain, as discussed further below.

The output of some or all of the transient distortion extraction subprocess 400, the output of some or all of the amplitude distortion subprocess 700/750, and/or the output of some or all of the periodic distortion extraction subprocess 900 may be combined to generate one or more two-dimensional ("2D") representations, collectively referred to herein as a device signature, as in 306. In some implementations, a 2D representation may be formed that includes the outputs from each of the transient distortion extraction subprocess 400, the outputs from each of the amplitude distortion subprocess 700/750, and the outputs from each of the periodic distortion extraction subprocess 900. In other implementations, only two of the subprocesses, such as the outputs from each of the transient distortion subprocess 400 and the outputs from the amplitude distortion subprocess 700/750 may be combined into a 2D representation. In still other examples, a first 2D representation may be generated based on each of the outputs from the transient distortion subprocess 400, a second 2D representation may be presented based on each of the outputs from the amplitude distortion subprocess 700/750, and a third 2D representation may be generated based on each of the outputs from the periodic distortion extraction subprocess 900. As will be appreciated, any combination of outputs from any of the subprocesses 400, 700, 750, 900 may be combined into one or more 2D representations, each of which may be collectively referred to as a device signature. The generated device signature may then be labeled to associate the device signature with the device type that generated the device signature and/or may be labeled to represent different stages of a device operation, as in 308.

Finally, a DNN may be trained using the labeled device signature, and other labeled device signatures determined through the example process 300, to produce a trained DNN, as in 310. In some implementations, a DNN may be trained to determine the likelihood that operation of a single device type is detected. For example, a DNN may be trained to process a device signature and output a probability score indicative of a probability that the device signature is representative of a particular device type or device type sequence pattern. In other examples, the DNN may be trained to detect device operation/sequence pattern of a plurality of devices. In such an example, the DNN may provide multiple probability scores in response to receiving a device signature, each probability score indicative of a probability that the device signature is indicative of a device sequence pattern of a particular device. For example, if the DNN is trained to detect device operation of a dishwasher, a dryer, a microwave, and a clothes washer, in response to a provided device signature, the DNN may output a probability score for each trained device, the probability scores providing a probability for each device as to whether operation of that device generated the device signature represented in the received voltage signal.

Figure 4:
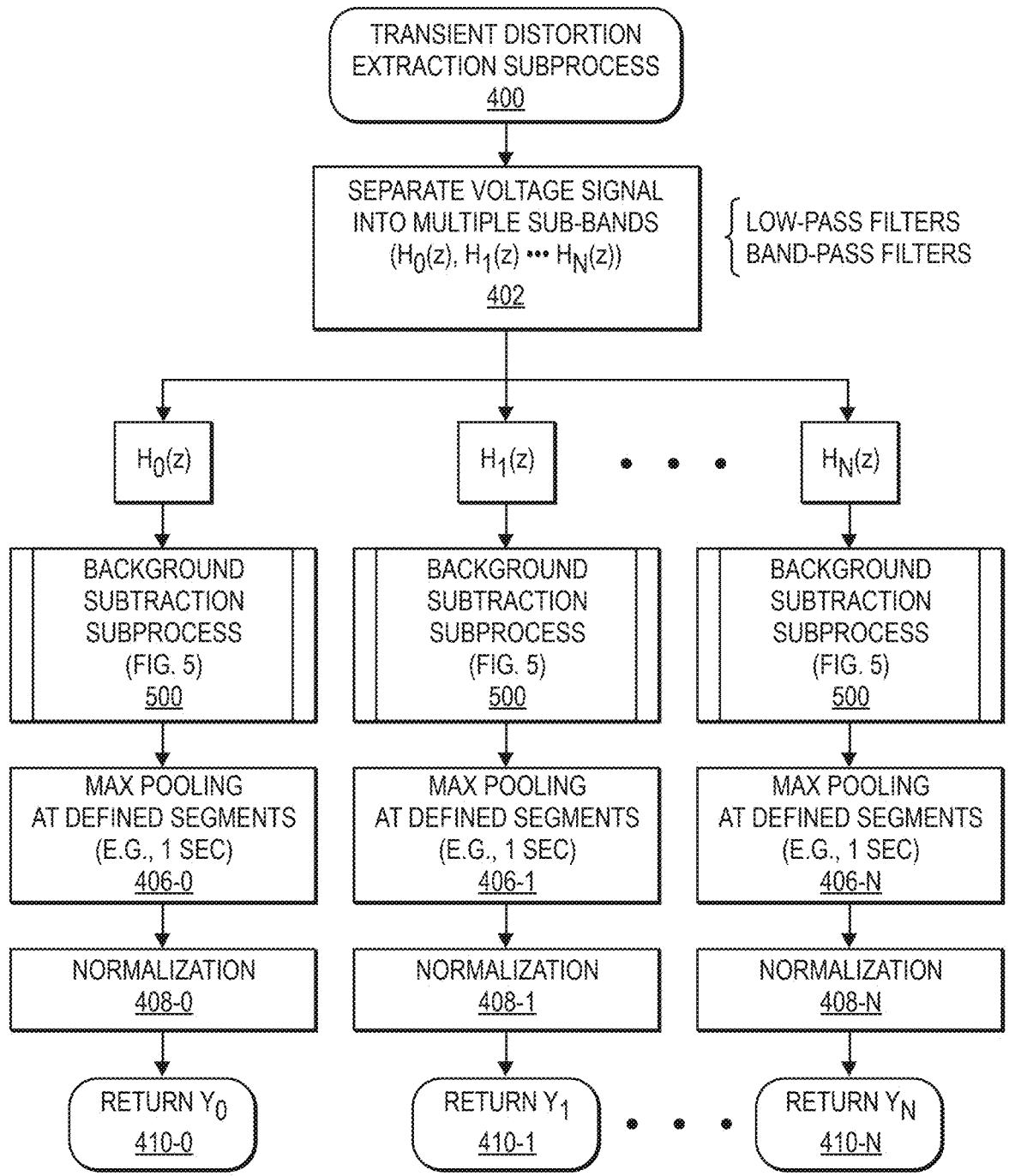
FIG. 4 is an example transient distortion extraction sub-process, in accordance with disclosed implementations.

FIG. 4 is an example transient distortion extraction subprocess 400, in accordance with disclosed implementations.

The example process 400 begins by separating a received voltage signal into multiple sub-bands ($H_0(z)$, $H_1(z)$, through $H_N(z)$), as in 402. For example, low-pass and/or band-pass filters may be used to separate the received voltage signal into multiple sub-bands. In one example, the voltage signal may be divided into fifty-six different sub-bands. In other examples, the voltage signal may be divided into additional or fewer sub-bands.

Processing multiple sub-bands preserves minimum information thereby improving transient detection and significantly reducing noise (periodic components). Additionally, multi-band processing serves as a transient distinction mechanism, i.e., transients with different frequency characteristics may vary in strength in different sub-bands.

Each sub-band of the voltage signal may then be processed by the example background subtraction subprocess 500, discussed further below with respect to FIG. 5. As discussed below, the output of the example background subtraction subprocess 500 for each sub-band may be a background subtracted voltage signal ($X_{bs}$).

To reduce the sample rate at each output of the background subtraction of each sub-band in each voltage signal, max pooling may be applied, as in 406-0, 406-1, through 406-N. For example, if the sample rate for the voltage signal is 192 kHz, and the voltage signal is thirty minutes in duration and measured on each of the LE lines 303-LE, NE lines 303-NE, and LN lines 303-LN, max pooling may be used to reduce the data down to, for example, one sample per second for each sub-band of each voltage signal so that each sample from each sub-band has a single sample value for each second, rather than 192,000 samples per second. In some implementations the sample rate may be higher or lower than 192 kHz.

Still further, in some implementations, the max pooled samples may be normalized to be in a defined range, such as between zero and one, as in 408-0, 408-1, through 408-N.

As a result of the background subtraction, discussed below, max pooling of the background subtracted results, and normalization, a background subtracted and normalized signal ($y_0$, $y_1$, through $y_N$) is output for each sub-band of a voltage signal, as in 410-0, 410-1, through 410-N. By selecting a voltage signal measurement duration and the sampling rate for max pooling, the segments of each background subtracted and normalized signal may correspond to the input size of the machine learning model to be trained.

The combination of max pooling and normalization to the background subtracted data provides a technical improvement as it extracts peaks present in the voltage signals without a threshold, which may result in loss of data.

Figure 5:
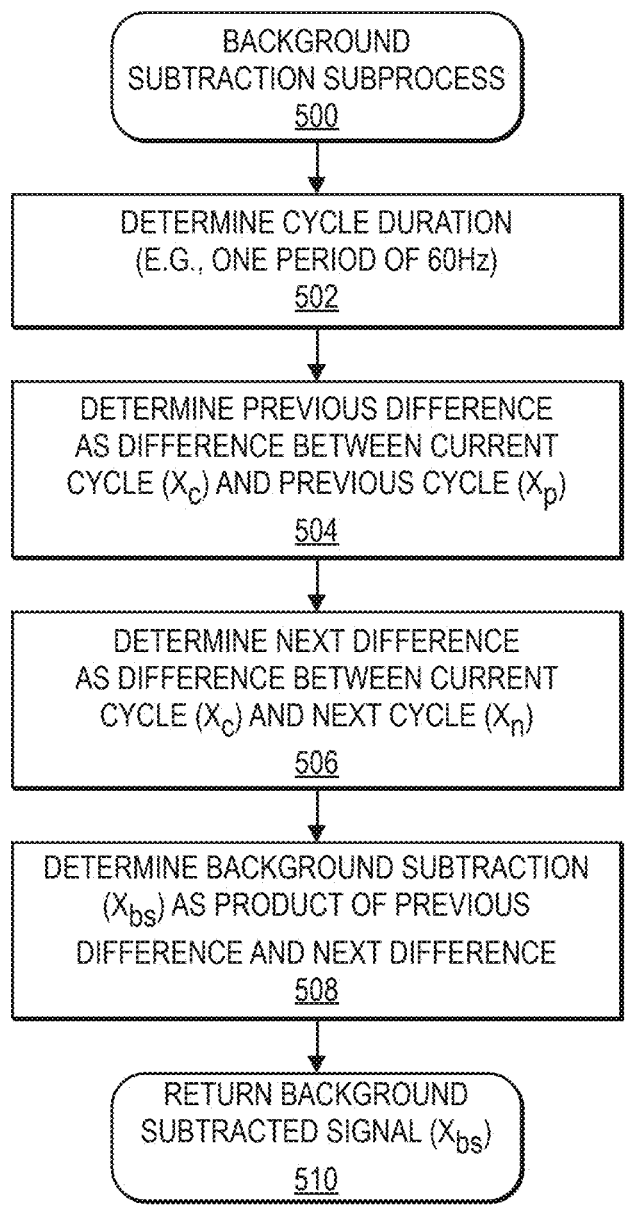
FIG. 5 is an example background subtraction process, in accordance with disclosed implementations.

FIG. 5 is an example background subtraction process 500, in accordance with disclosed implementations.

Figure 6A:
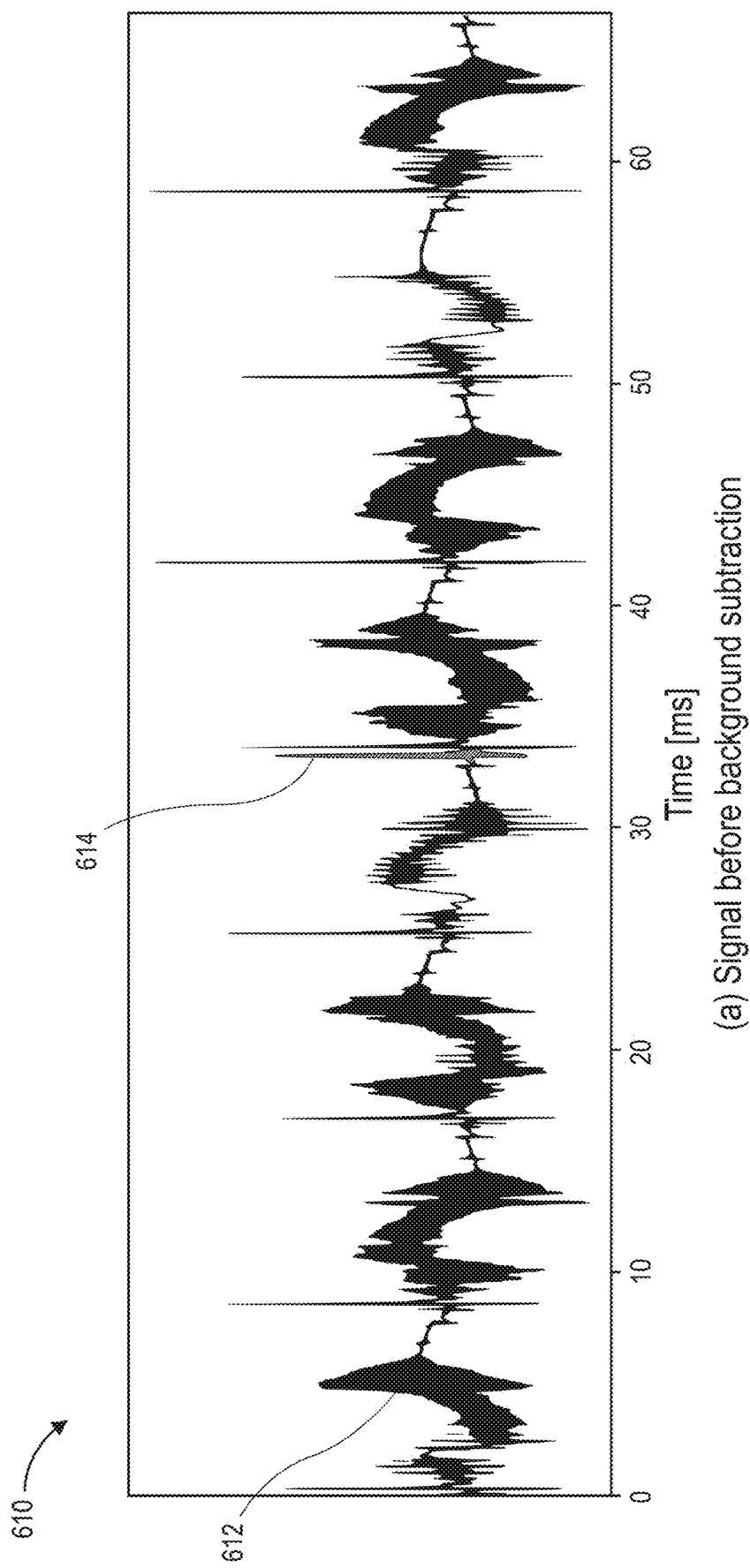
FIG. 6A is an example illustration of a device voltage signal, in accordance with disclosed implementations.

Background subtraction, as discussed with respect to FIG. 5, may be utilized to separate periodic distortion from non-periodic transients that are the result of device operation on the electrical circuit from which a voltage signal is measured. For example, referring to FIG. 6A, illustrated is a voltage signal 610 measured on an electrical circuit when a dryer (device) is operating. The transient 614 corresponds to the dryer heating element turning on event. In addition to the transient 614, there are periodic components present in the signal 610. First, the main voltage 612 is periodic, in this example 60 Hz. Second, non-linear loads on the electrical circuit create periodic distortions. To remove these periodic components, the example process 500 may be performed.

The example subprocess begins by determining a cycle period of a known background signal, such as 60 Hz, as in 502. Determination of the cycle period may be determined from the voltage signal and the repeating pattern of the voltage signal or may be known for the location for which the voltage signal is measured. Background subtraction may be performed by determining a previous difference between a current cycle ($X_c$) and a previous cycle ($X_p$) of the voltage signal, as in 504. In addition, a next difference may be determined as a difference between the current cycle ($X_c$) and a next cycle ($X_n$), as in 506.

Finally, the background subtracted cycle ($X_{bs}$) may be determined as the product of the determined previous difference and the determined next difference, as in 508.

The example process may be performed for each cycle of a voltage signal and a corresponding background subtracted cycle ($X_{bs}$) determined for each cycle. Accordingly, the following equation (1), which corresponds to FIG. 5, may be determined for each cycle of a voltage signal, or sub-band of a voltage signal to produce a background subtracted signal:

$$x_{bs}=(x_c-x_p)*(x_c-x_n) \tag{1}$$

Finally, the background subtracted signal $X_{bs}$ may be returned as the background subtracted voltage signal, or sub-band filtered and background subtracted voltage signal, as in 510.

Figure 6B:
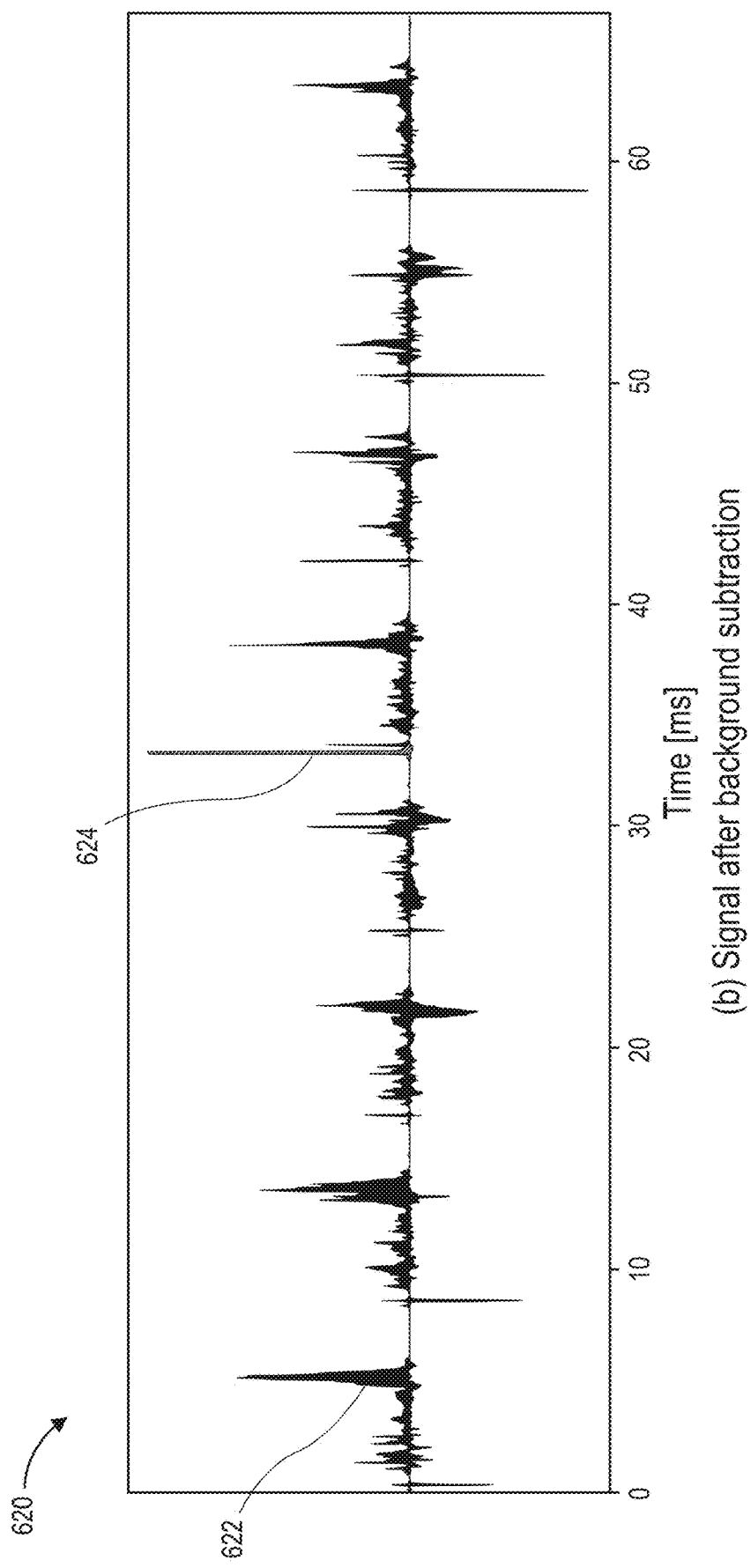
FIG. 6B is an example illustration of the device voltage signal of FIG. 6A after background subtraction, in accordance with disclosed implementations.

FIG. 6B is an example illustration of the device voltage signal of FIG. 6A after background subtraction, in accordance with disclosed implementations.

As illustrated by the background subtracted signal 620, the majority of the periodic components present in the voltage signal 610 (FIG. 6A) have been removed without losing data corresponding to the transient distortion 624. However, fragments 622 of the periodic signal may not be removed due to the infrequent nature of the periods and/or because the portions may not be periodic.

Figure 6C:
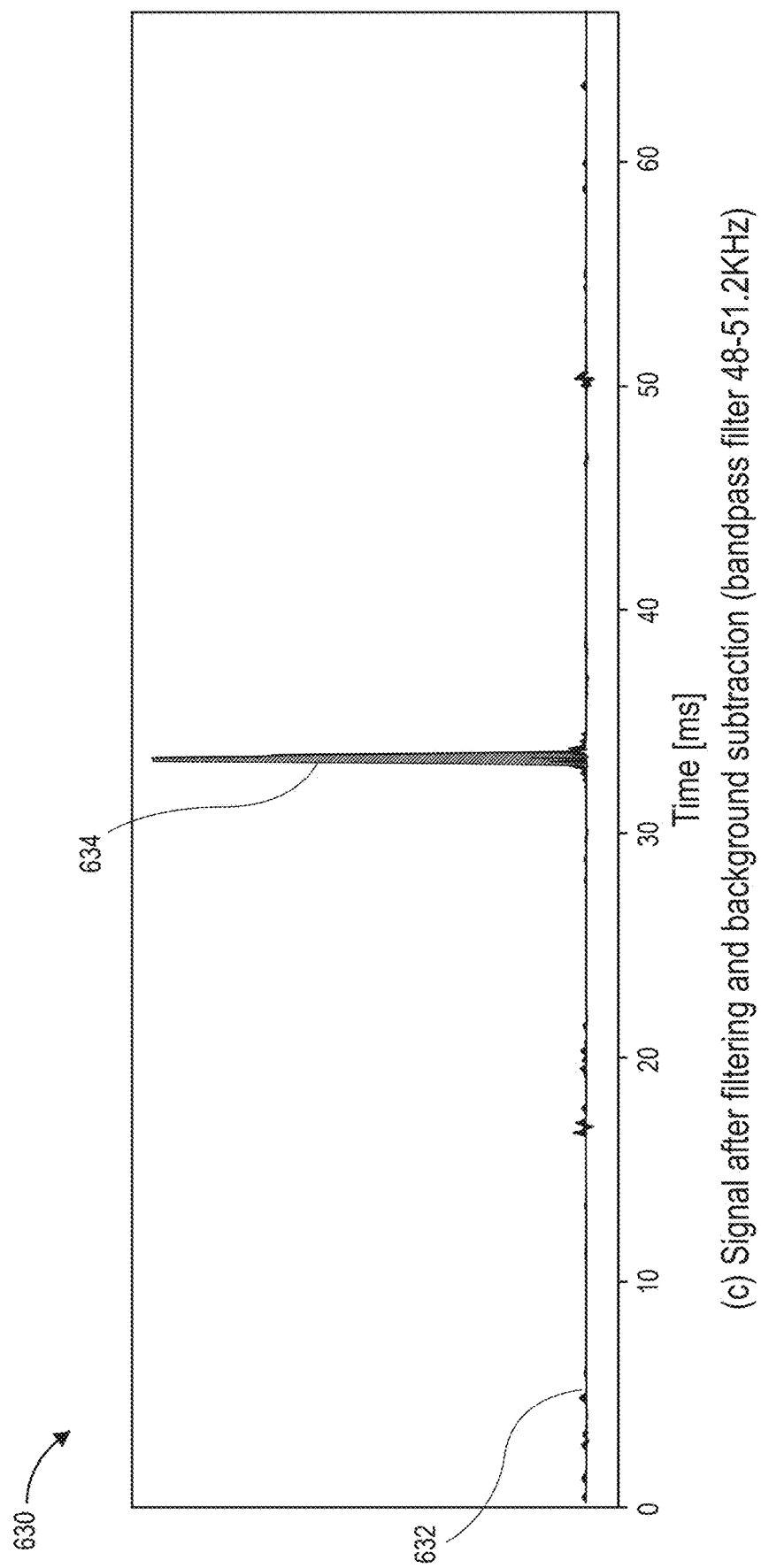
FIG. 6C is an example illustration of the device voltage signal of FIG. 6A after filtering and background subtraction, in accordance with disclosed implementations.

FIG. 6C is an example illustration of the device voltage signal of FIG. 6A after filtering the voltage signal into multiple sub-bands and performing background subtraction on each sub-band, as discussed above, in accordance with disclosed implementations. The filtered and background subtracted voltage signal 630 corresponds to the 48-51.2 KHz rage.

As discussed above, the voltage signal may be filtered into multiple sub-bands and background subtraction performed on each sub-band of the voltage signal. In other implementations, background subtraction may be performed on the voltage signal and then the background subtracted voltage signal separated into the different sub-bands.

As illustrated, the filtered and background subtracted signal 630 corresponds to one of those sub-bands for a voltage signal, after background subtraction is performed on that sub-band, as discussed above. As illustrated in FIG. 6C, almost all periodic components 632 of the signal are eliminated, again without reducing or losing data corresponding to the transient distortion 634.

Figure 7B:
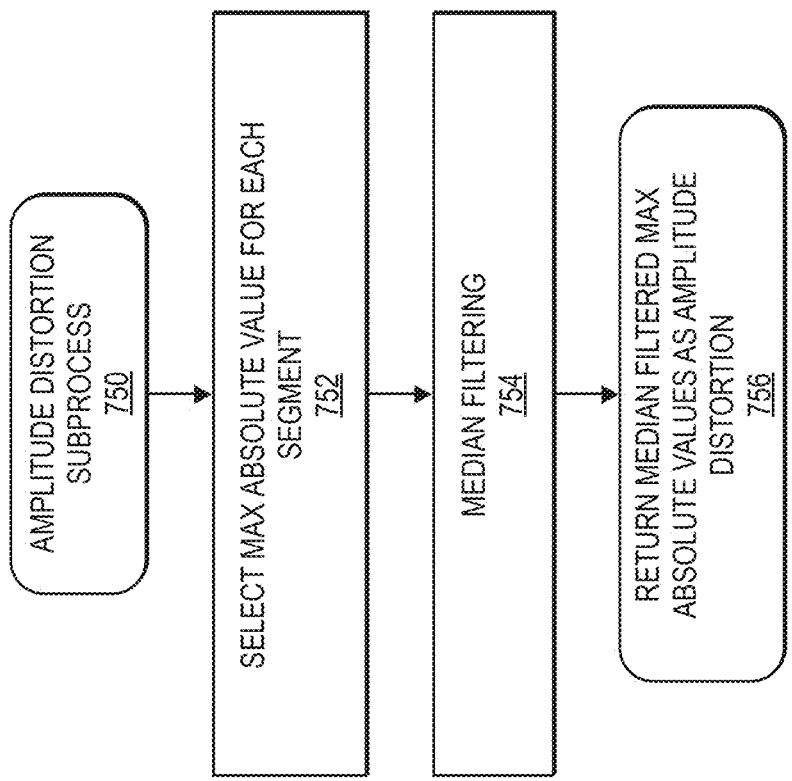
FIGS. 7A and 7B are example amplitude distortion sub-processes, in accordance with disclosed implementations.
Figure 7A:
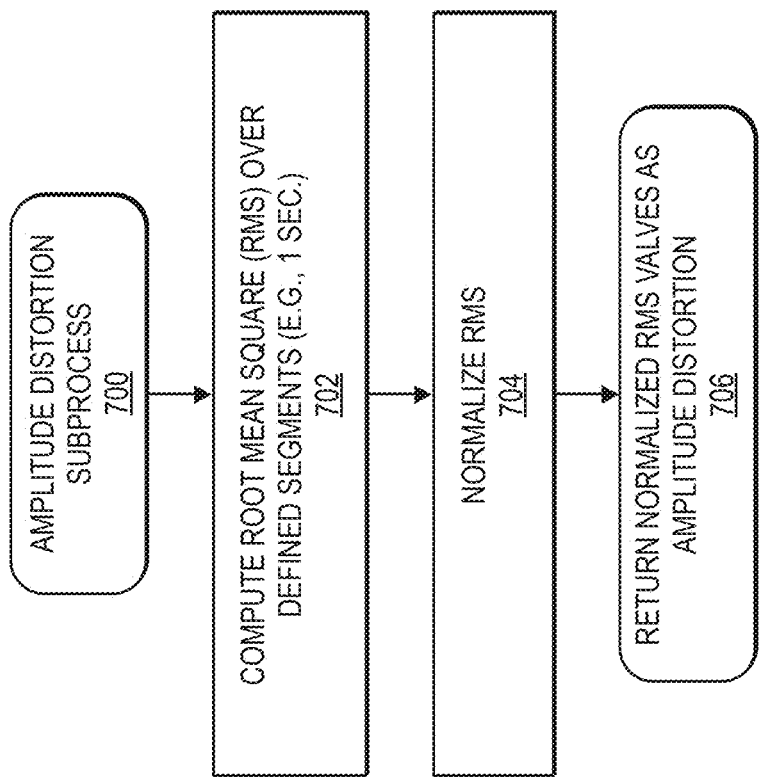

FIG. 7A is an example amplitude distortion subprocess 700, in accordance with disclosed implementations. Current that flows through an electrical circuit to a device induces a voltage drop on the impedance of wires, which lowers the line voltage. This amplitude distortion is more prominent for high energy devices, such as dryers, ovens, water heaters, etc.

The example process 700 begins by computing a root mean square ("RMS") for each defined segment, such as one second, for a voltage signal, as in 702. For example, if the max pooling for each segment is performed at one second increments, RMS may likewise be determined for the same defined segments (e.g., 192,000 samples), in this example, one-second segments. As noted above, in other implementations, the sample rate may be higher or lower than 192,000.

In the illustrated example, the determined RMS values for each segment may also be normalized to a defined range, such as between zero and one, as in 704. For example, for each segment, a mean and standard deviation may be determined from the RMS values of that segment. Normalization may then be computed by subtracting the mean from the signal and dividing by the standard deviation. Finally, the normalized RMS values for the voltage signal duration may be returned as the amplitude distortion for the voltage signal, as in 706.

FIG. 7B is another example amplitude distortion subprocess 750, in accordance with disclosed implementations.

In the example illustrated with respect to FIG. 7B, rather than computing RMS over defined segments, max pooling may be used to determine a max absolute value for each segment, as in 752.

In some instances, the result of max pooling to determine the max absolute value for each segment may result in a signal that contains undesired peaks that are caused by the transients present in the voltage signal that do not reflect the actual amplitude distortion. To remove the undesired peaks, median filtering may be applied, as in 754. Finally, the median filtered max absolute values may be returned as the amplitude distortion for the voltage signal, as in 756.

In some implementations, the amplitude distortion process 700 (FIG. 7A) may be used to determine amplitude distortion from a voltage signal measured across the LE wires and the amplitude distortion process 750 (FIG. 7B) may be used to determine amplitude distortion from the voltage signal measured across the NE wires.

Figure 8A:
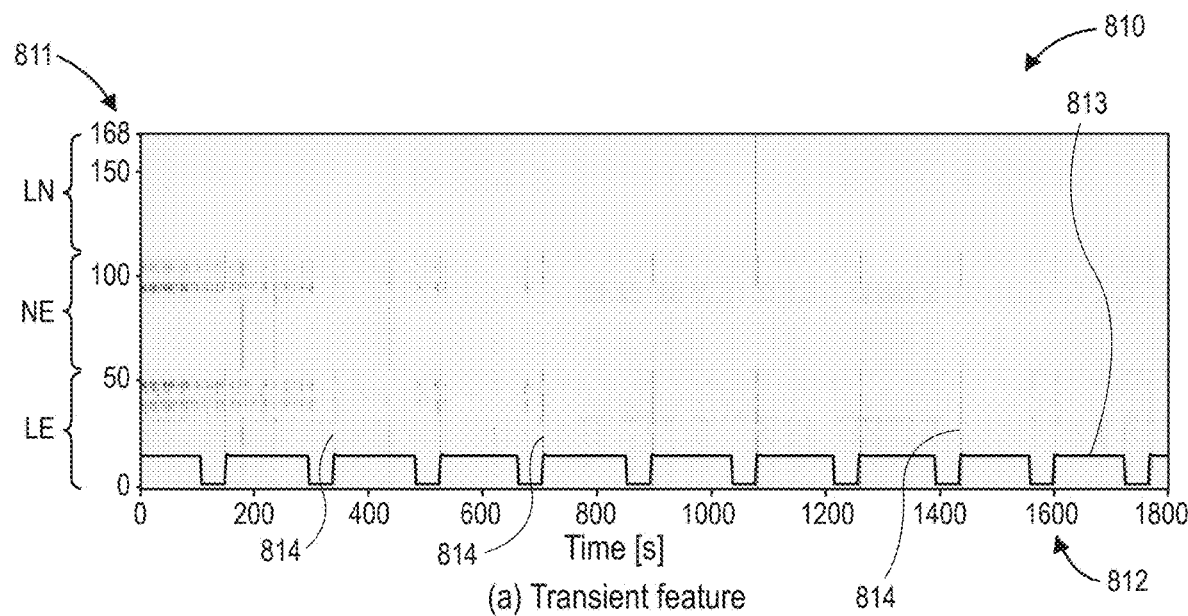
FIG. 8A is an example illustration of a 2D representation produced from detected transient distortion(s), in accordance with disclosed implementations.

FIG. 8A is an example illustration of a 2D representation 810 produced from detected transient distortions of a voltage signal, in accordance with disclosed implementations.

As a result of the example processes discussed above, the transient distortion may be a 2D representation, with each row 811 corresponding to a different sub-band and each column 812 representing the defined segments (e.g., one second segments). For example, if 56 sub-bands are utilized for a voltage signal, the output 2D representation will have 56 rows. Likewise, if the voltage signal is measured for a defined duration of thirty minutes, which equates to 1800 seconds, the 2D representation of the transient distortion determined for that voltage signal will have 1800 columns 812.

As discussed above, in some implementations, the voltage signal may be measured across three different pairs of wires (e.g., LE, NE, and LN) and the transient distortions extracted independently for each voltage signal. As a result, the 2D representations of the transient distortions for each voltage signal may be stacked vertically to form a larger 2D representation 810. In the illustrated example, the first 56 rows of the 2D representation 810 correspond to the 56 sub-bands measured with respect to the LE line, rows 57-112 correspond to the 56 sub-bands measured with respect to the NE line, and rows 113-168 correspond to the 56 sub-bands measured with respect to the LN line. In implementations in which only the LE and NE lines are measured, the final 2D representation of the transient distortions may only have 112 rows and 1800 columns. Alternatively, rather than forming a single 2D representation with the transient distortions for each voltage signal measured on the different pairs of wires, a different 2D representation may be formed for each pair of wires. For example, a first 2D representation may be formed that is representative of the transient distortions determined from the voltage signal measured across the LE wires, a second 2D representation may be formed that is representative of the transient distortions determined from the voltage signal measured across the NE wires, and/or a third 2D representation may be formed that is representative of the transient distortions determined from the voltage signal measured across the LN wires.

In the 2D representation 810, the line 813 is illustrated for reference and is indicative of the current drawn by the dryer device. As illustrated, the line 813 shows a cycling pattern as the dryer heater turns on and off. In the 2D representation, the vertical bars 814 of the detected transient distortions are aligned with the dryer heater turning on events.

Figure 8B:
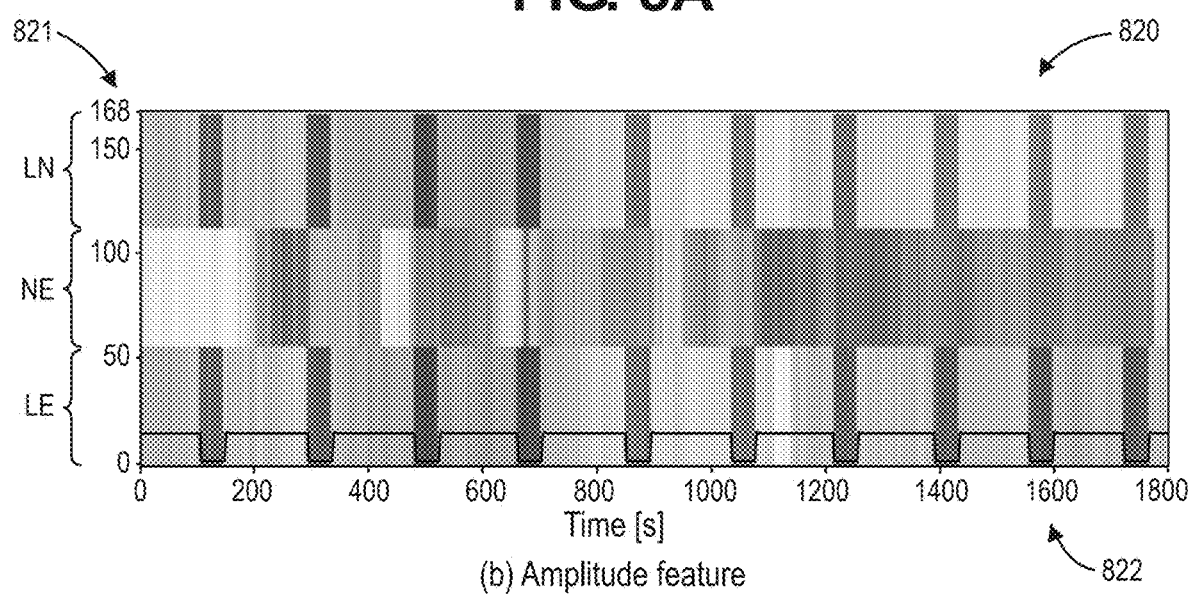
FIG. 8B is an example illustration of a 2D representation produced from detected amplitude distortion(s), in accordance with disclosed implementations.

FIG. 8B is an example illustration of a 2D representation 820 produced from detected amplitude distortion, in accordance with disclosed implementations.

As discussed above, the amplitude distortion is a one-dimensional signal with a sample rate that matches the sample rate of the transient distortion, in this example one second. Similar to transient distortion, each amplitude distortion measured for each of the different voltage signals measured on the different lines (LE, NE, LN) may be vertically stacked to produce a 2D representation 820 of the amplitude distortion that includes 1800 columns 822, each column corresponding to a segment, and 168 rows 821, each row corresponding to an amplitude distortion measured for each sub-band for each voltage signal. For example, the first 56 rows of the 2D representation 820 may correspond to the amplitude distortions determined for the 56 sub-bands of the voltage signal measured on the LE lines, rows 57-112 may correspond to the amplitude distortions determined for the 56 sub-bands of the voltage signal measured on the NE lines, and rows 113-168 may correspond to the amplitude distortions determined for the 56 sub-bands of the voltage measured on the LN lines. Also, as discussed above, if voltage signals are only measured on the LE and NE lines, the 2D representation 820 of the amplitude distortion may only include 112 rows and 1800 columns. Alternatively, rather than forming a single 2D representation with the amplitude distortions for each voltage signal measured on the different pairs of wires, a different 2D representation may be formed for each pair of wires. For example, a first 2D representation may be formed that is representative of the amplitude distortions determined from the voltage signal measured across the LE wires, a second 2D representation may be formed that is representative of the amplitude distortions determined from the voltage signal measured across the NE wires, and/or a third 2D representation may be formed that is representative of the amplitude distortions determined from the voltage signal measured across the LN wires.

To train the DNN, a computer vision DNN may be utilized. As is known, most computer vision DNNs expect three inputs, a Red Channel, Green Channel, and Blue Channel. Accordingly, for the disclosed implementations, a computer vision DNN may be trained by providing the 2D representation of the transient distortion on a first channel, such as the Red Channel, the 2D representation of the amplitude distortion on a second channel, such as the Green Channel, and providing null values on the third channel, such as the Blue Channel.

Figure 9:
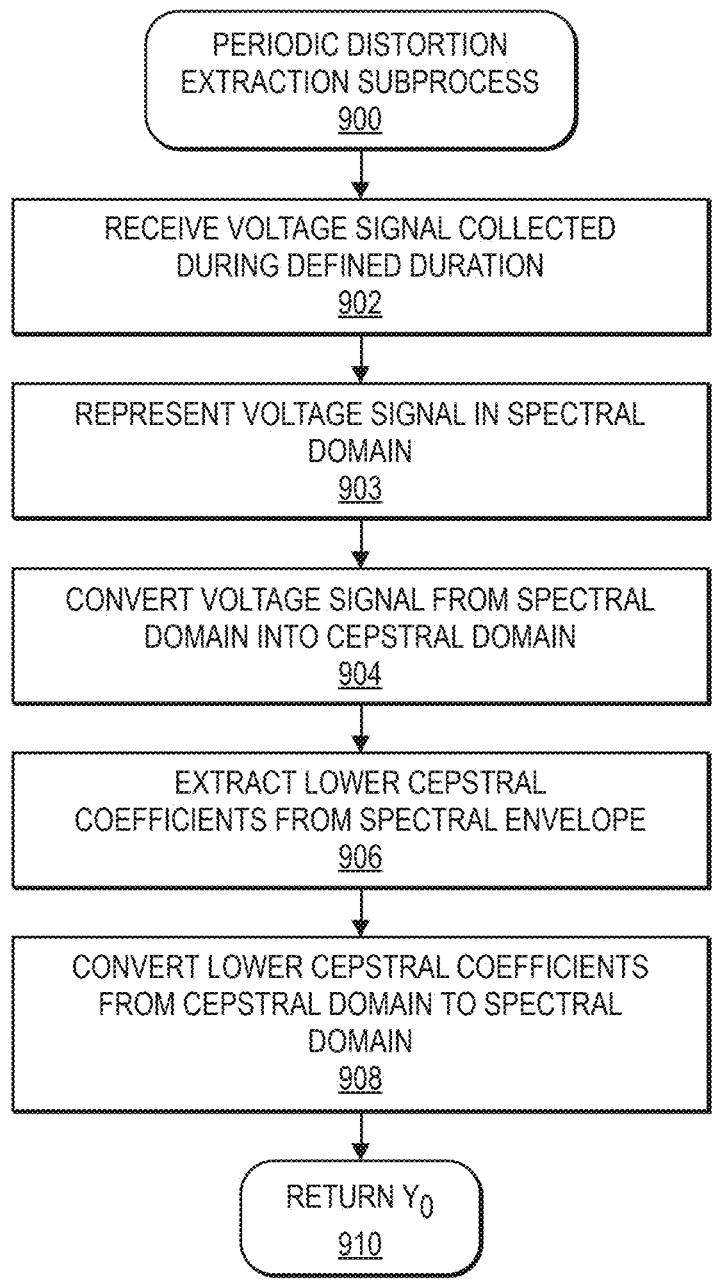
FIG. 9 is an example periodic distortion extraction sub-process, in accordance with disclosed implementations.

FIG. 9 is an example periodic distortion extraction sub-process 900, in accordance with disclosed implementations.

Figure 10:
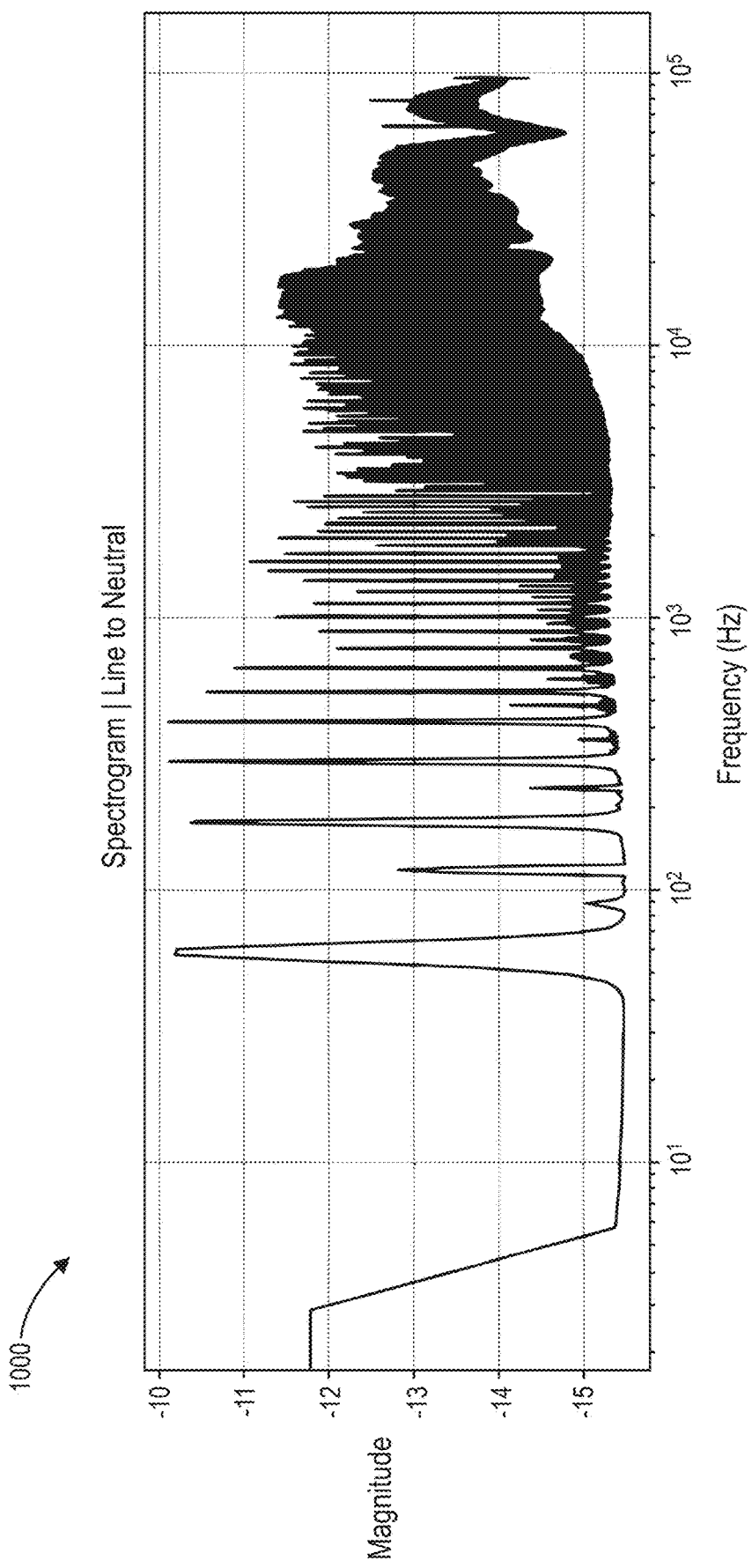
FIG. 10 is an example illustration of a spectrogram of a voltage measured between the line to neutral wires of an electrical circuit, in accordance with disclosed implementations.
Figure 11:
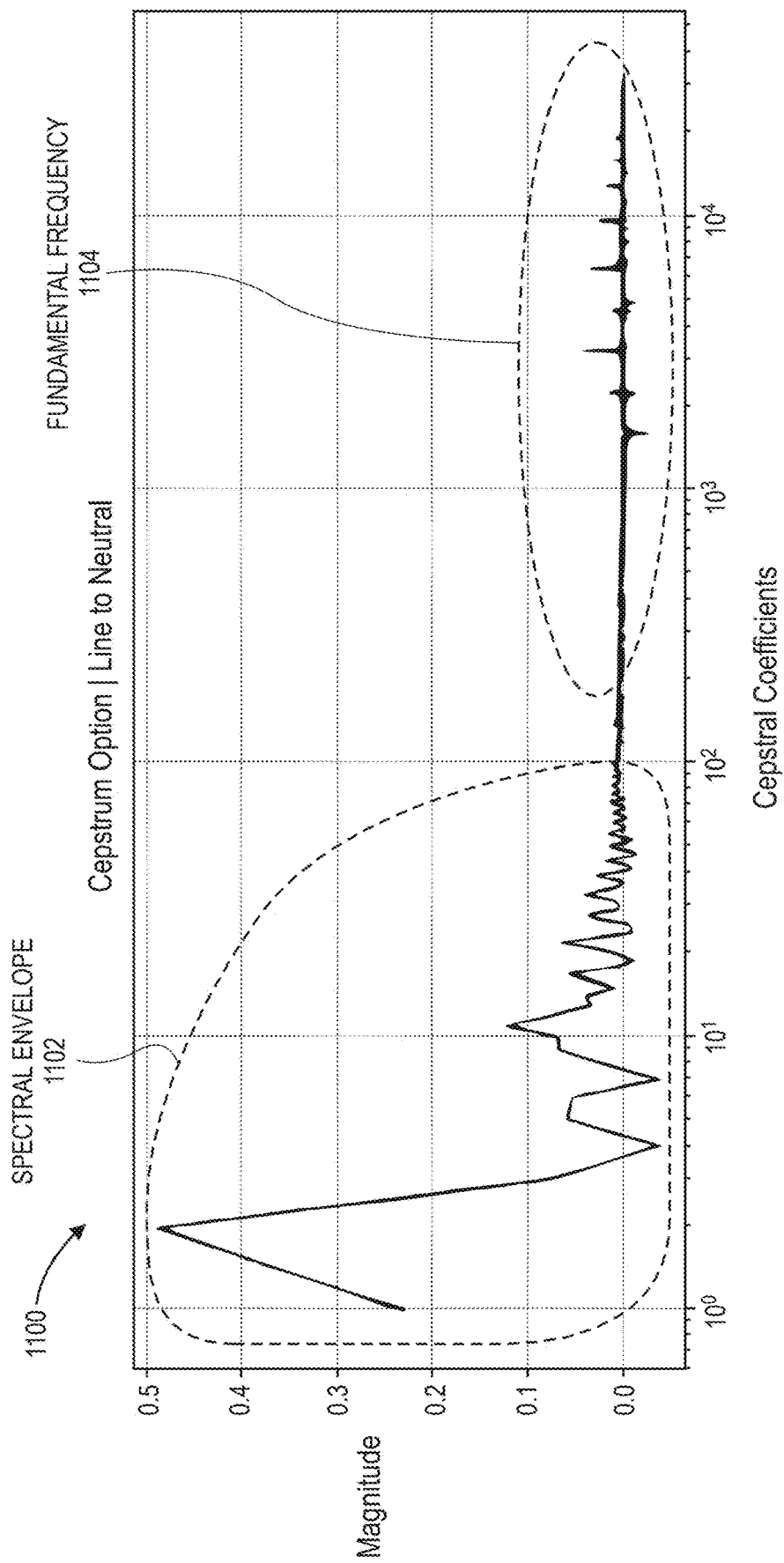
FIG. 11 is an example illustration of the voltage illustrated in FIG. 10 in the cepstral space, in accordance with disclosed implementations.
Figure 12:
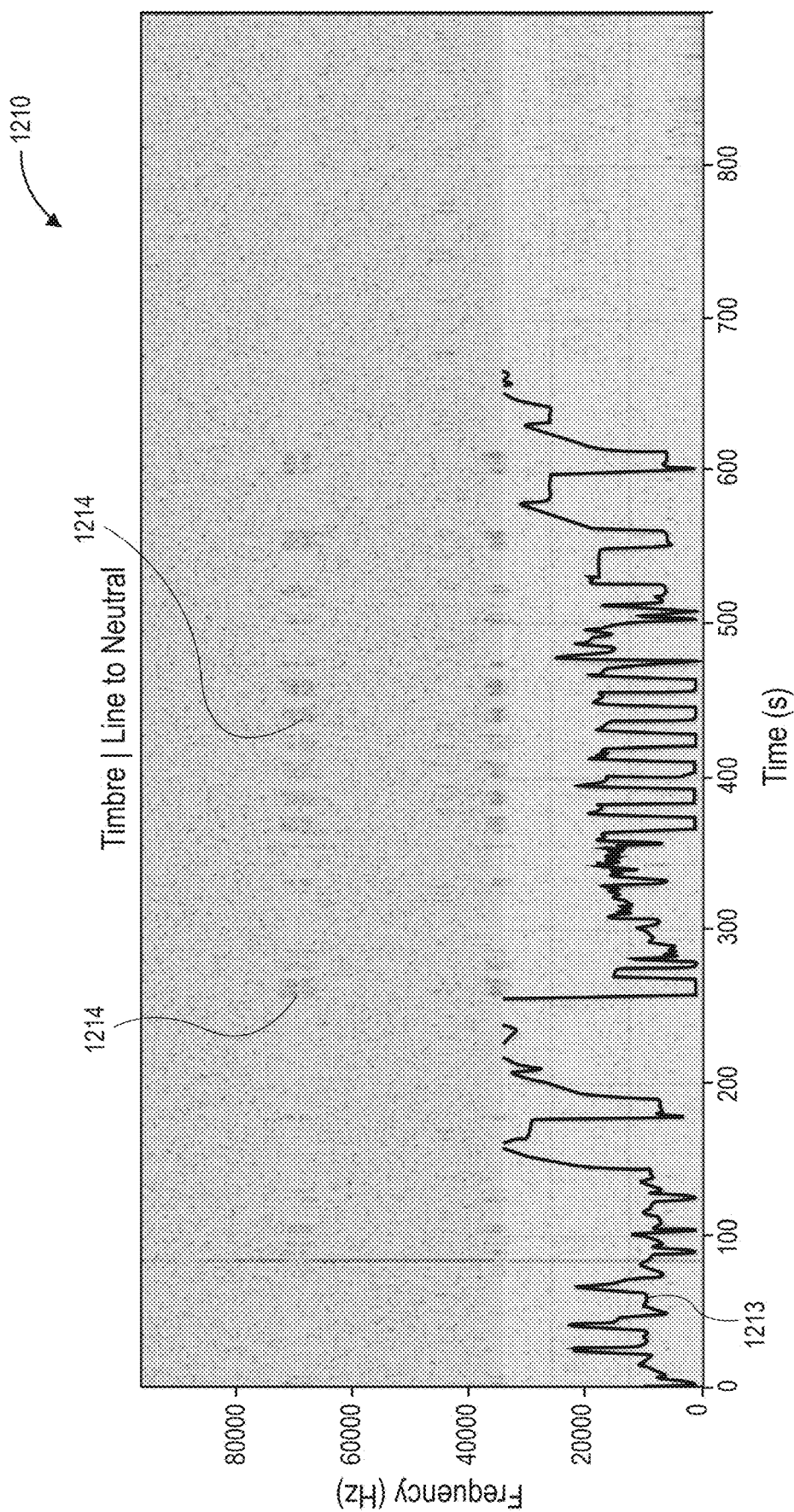
FIG. 12 is an example illustration of a spectrogram of timbre features extracted from a voltage signal, in accordance with disclosed implementations.

In the example discussed with respect to FIG. 9 and illustrated in FIGS. 10 through 12, the voltage signal may be converted from the spectral domain to the Cepstral domain, processed, and a portion thereof returned to the spectral domain, thereby removing the periodic portion of the voltage signal.

Referring briefly to FIG. 10, illustrated is a spectrogram periodogram 1000 of a voltage measured between the line and neutral wires of an electrical circuit, in accordance with disclosed implementations. The spectrogram periodogram 1000 illustrates both the harmonic and inter harmonic components. However, transient distortions cannot be discerned or extracted therefrom, without additional processing.

To resolve this deficiency, the example process 900 begins upon receipt of a voltage signal measured from an electrical circuit during a defined duration, such as thirty minutes, as in 902. The voltage signal may first be represented in the spectral domain, as in 903, and then converted from the spectral domain into a Cepstral domain to isolate the spectral envelope, as in 904. Converting the voltage signal into the Cepstral domain may be obtained through an inverse Fourier transform:

$$C_k = \text{IFFT}(\log(|\text{FFT}(x_k)|))$$

The Cepstral coefficient $C_k$ is a two-dimensional vector of the k-th segment where each dimension corresponds to a quefrency. The Cepstral coefficients represent how the spectrum changes over frequency. For example, referring to FIG. 11, illustrated is a Cepstral periodogram showing the Cepstral coefficients corresponding to the voltage signal indicated in the spectrogram periodogram 1000 (FIG. 10). As illustrated in FIG. 11, the higher Cepstral coefficients 1104 correspond to the fundamental frequency of all the harmonics of the voltage signal and the lower Cepstral coefficients 1102 represent the spectral envelope, which corresponds to the transient distortion(s).

Accordingly, returning to FIG. 9, the example process 900 extracts the lower Cepstral coefficients from the spectral envelope, as in 906. For example, the high quefrency features in the Cepstral transform are suppressed, retaining only the Cepstral coefficients of the spectral envelope as:

$$C_k^{env}[q] = C_k[q] \text{ if } q < q_{max} \text{ else } 0$$

Finally, the lower Cepstral coefficients may be converted back from the Cepstral domain to the spectral domain, as in 908. For example, a Fourier transform may be applied to the lower Cepstral coefficients to produce timbre features Ti for the k-th segment of the voltage signal:

$$T_k = \text{FFT}(C_k^{env})$$

FIG. 12 is an example illustration of a spectrogram of the timbre features extracted from a voltage signal in accordance with the example process 900 of FIG. 9. Similar to FIG. 8A, the line 1213 is overlaid on the spectrogram 1210 to show the cycling pattern events of a device. Through the use of the disclosed implementations, as illustrated in the 2D representation of the spectrogram 1210, the vertical bars 1214, which correspond to the detected transient distortions indicated by the timbre features, are visible in the spectrogram and aligned with the events of the device.

Figure 13:
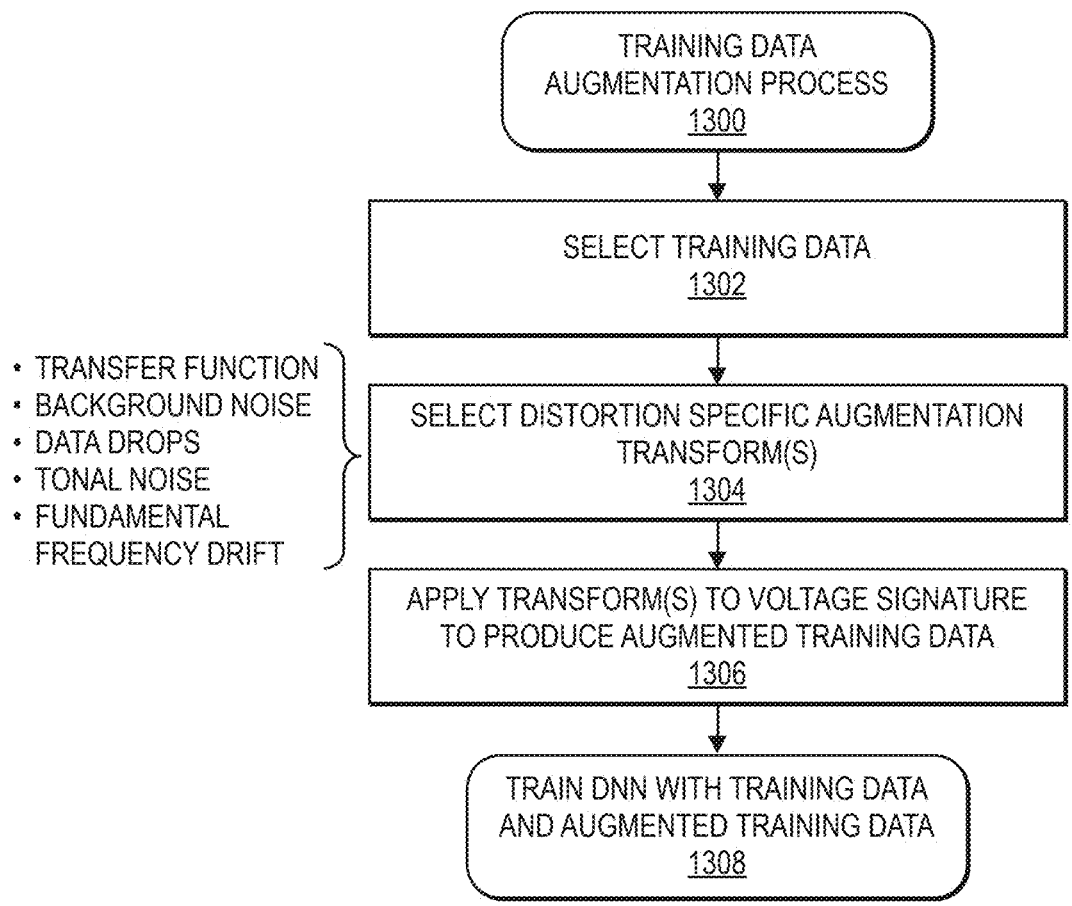
FIG. 13 is an example training data augmentation process, in accordance with disclosed implementations.

FIG. 13 is an example training data augmentation process 1300, in accordance with disclosed implementations. The example process 1300 and/or the example process 1400 discussed below with respect to FIG. 14 may be utilized to generate additional training data for use in training a DNN to detect device type and/or device operation, in accordance with the disclosed implementations. Accordingly, a plurality or original training data items that may be used to train a DNN in accordance with the disclosed implementations may be increased through the example training data augmentation process 1300 and/or the example training data emulation process 1400.

The example process 1300 begins by selecting an item of training data, such as the labeled training generated in accordance with the above-described implementations, as in 1302. In some implementations, the example process 1300 may be performed one or more times for each item of training data that is generated, thereby further increasing the corpus of training data that may be used to train a DNN. In addition, one or more augmentation transforms may be selected for use in augmenting the training data, as in 1304. For example, one or more of a transfer function transform, background noise transform, data drops transform, tonal noise transform, and/or frequency drift transform may be selected for use with the example process 1300. In some implementations, the example process may be performed multiple times for the same item of training data, with each instance of the example process 1300 augmenting the training data using a different augmentation transform. In other implementations, the augmentation transform to be applied to the training data may be randomly selected, or selected according to a defined order or pattern.

Upon selection of an augmentation transform, the training data item is augmented by applying the transform to the device signature of the training data to produce augmented training data, as in 1306. For example, the transfer function transform may be applied to the device signature to adjust the device signature. The background noise transform may be applied to the device signature to introduce additional background noise into the device signature. The data drops transform may be applied device signature to remove or drop some of the data represented in the device signature. The tonal noise transform may be applied to the device signature to introduce tonal noise. The frequency drift transform may be applied to the device signature to introduce frequency drift. Application of the one or more transforms alters the device signature thereby generating augmented training data corresponding to the device.

In other implementations, the selected transform(s) may be applied to the voltage signal prior to processing to generate the device signature. In still other examples, some transforms may be applied to the voltage signature prior to processing and other transforms may be applied to the resulting device signature.

Finally, a DNN may then be trained with the originally generated training data, the additional augmented training data generated in accordance with the example process 1300, and/or the emulated training data generated in accordance with the example process 1400 (FIG. 14), as in 1308.

Figure 14:
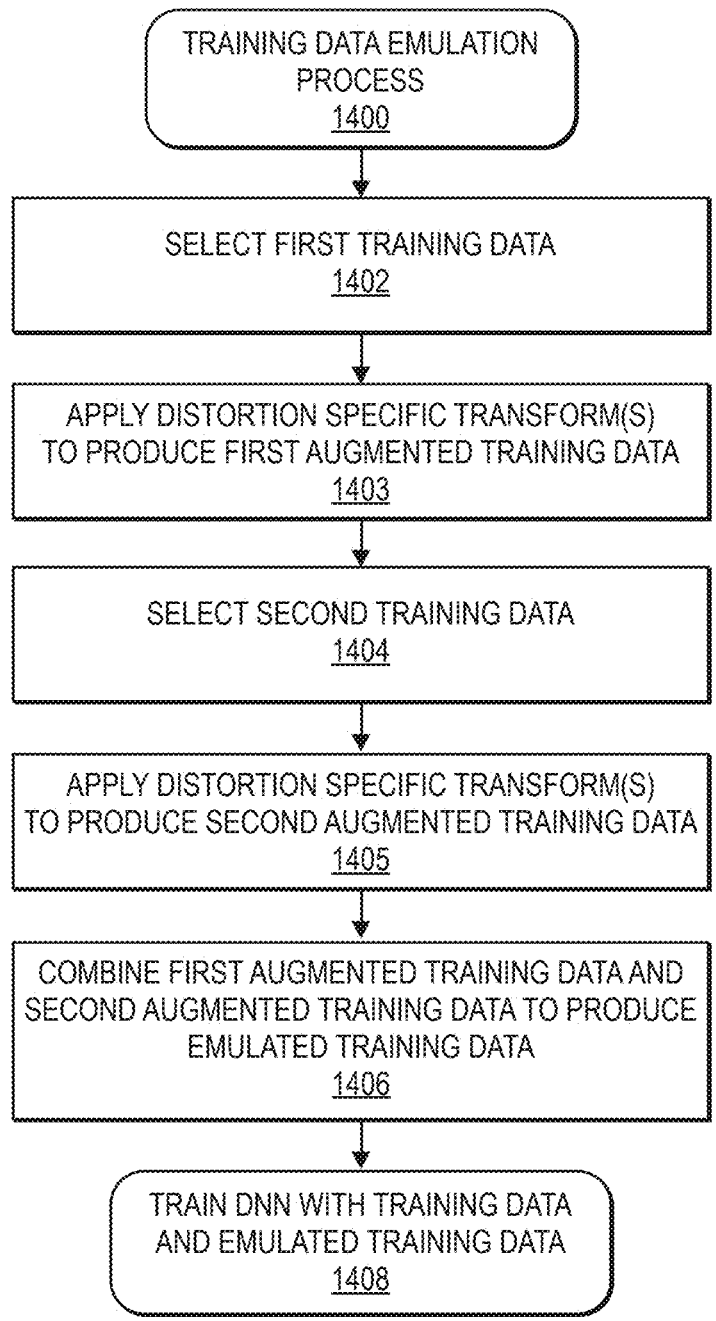
FIG. 14 is an example training data emulation process, in accordance with disclosed implementations.

FIG. 14 is an example training data emulation process 1400, in accordance with disclosed implementations.

The example process 1400 begins by selecting a first training data item, as in 1402. The first training data may then be augmented with one or more distortion specific transforms, such as a transfer function transform, background noise transform, a data drops transform, a tonal noise transform, a fundamental frequency drift transform, etc., to produce first augmented training data. Likewise, a second training data item is also selected, as in 1404, and one or more of the distortion specific transforms applied to the second training data to produce second augmented training data, as in 1405. The distortion specific transform(s) applied to the second training data may be the same or different than the distortion specific transform(s) applied to the first training data.

Any of a plurality of training data items may be selected as the first training data item and/or the second training data item. In some implementations, the first training data item and/or the second training data item may be randomly selected. In other implementations, the example process 1400 may be performed for each training data item and potential combination of training data items, thereby producing emulated training data from every potential combination of training data items. Likewise, while the example process 1400 discusses augmenting the first training data and the second training data with one or more distortion specific transforms, in other implementations, one or both of the first training data and the second training data may not be augmented. Likewise, if the training data is augmented, the same or different distortion specific transforms may be applied to the first training data and the second training data.

The selected first augmented training data item and the selected second augmented training data item may then be combined to produce an emulated training data item, as in 1406. For example, the first training data item may correspond to a first device type as measured and determined at a first location and the second training data item may correspond to the first device type as measured and determined at a second location.

Combining of the training day may include overlaying the first augmented training data and second augmented training data to produce the emulated training data. In other implementations, the augmented training data may be combined using other techniques. By combining the first training data item and the second training data item, additional permutations of the device signature for the first device type can be emulated.

Finally, a DNN may then be trained with the originally generated training data, the additional augmented training data generated in accordance with the example process 1300 (FIG. 13), and/or the emulated training data generated in accordance with the example process 1400, as in 1408.

Figure 15:
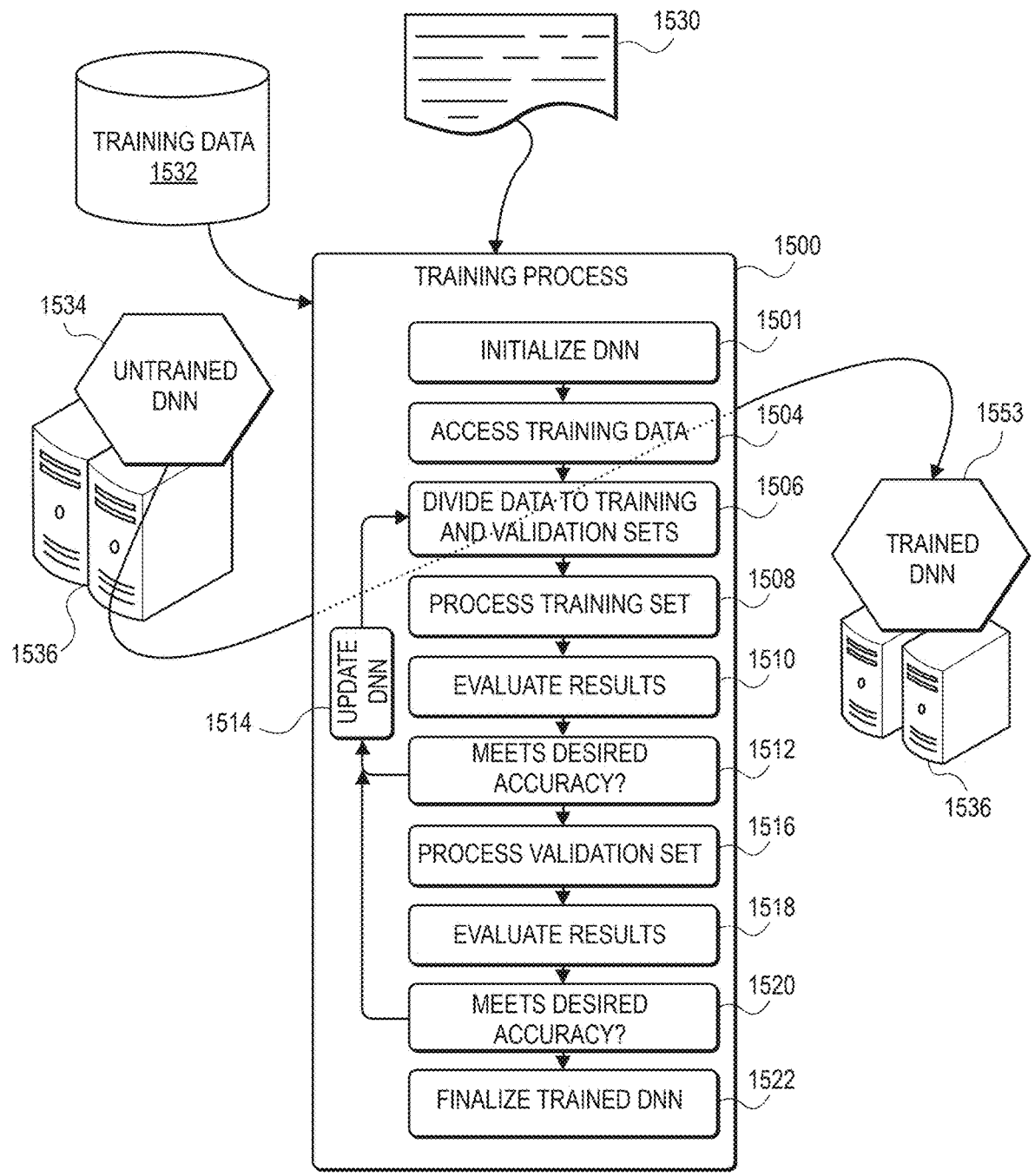
FIG. 15 is an example training process for training a deep neural network for health care safety scoring, in accordance with disclosed implementations.

FIG. 15 illustrates an exemplary overall process 1500 of training a DNN in accordance with aspects of the disclosed subject matter. Indeed, as shown in FIG. 15, the training process 1500 is configured to train an untrained DNN 1534 operating on a computer system 1536 to transform the untrained DNN into a trained DNN 1553 that operates on the same or another computer system, such as a remote computing resource 1536. In the course of training, as shown in the training process 1500, at step 1501, the untrained DNN 1534 is initialized with training criteria 1530. Training criteria 1530 may include, but is not limited to, information as to a type of training, number of layers to be trained, the device type(s) for which the DNN is to be trained, etc.

At step 1504 of training process 1500, a corpus of training data 1532, which may include training data that includes 2D representations of the device type(s) for which the device is to be trained (positive training data) and 2D representations of device types for which the device is not being trained (negative training data). As discussed above, the 2D representations may be generated in accordance with the disclosed implementations. For example, the DNN may be an image processing DNN and configured to receive three inputs. In such an example, as discussed above, the DNN may receive as inputs a 2D representation of the transient distortions for a device type, generated as discussed above, and a 2D representation of the amplitude distortions, generated as discussed above. If a third input is to be provided to the DNN, the third input may include a 2D representation of the periodic distortions, generated as discussed above. As another example, the third input may include supplemental information corresponding to the source of location corresponding to the training data. Supplemental information may include, but is not limited to, occupancy detection, time of day, day of week, weather, other devices operating at the location or recently in operation at the location, etc. The supplemental information may be used by a trained DNN as a further input to determine the probability that a 2D representation corresponds to a particular device type or sequencing pattern of the device type. Alternatively, if only one of the 2D representations are being provided, the other three inputs may be all null values, or supplemental information. Likewise, if only two of the 2D representations are being provided, the third input may be all null values, or supplemental information.

If training is to generate a trained DNN that outputs a first probability score indicative of a first probability that 2D representation corresponds to a sequencing pattern of a first device, the training data 1532 may include both 2D representation that correspond to the device type and 2D representations that do not correspond to the device type. As another example, if the DNN is to be trained to output a probability score for a first device type, a probability score for a second device type, etc., the training data may include 2D representations corresponding to the different devices for which the DNN is being trained to detect. In some implementations, the training data may include supplemental information corresponding to the 2D representations.

The disclosed implementations discuss the use of labeled training data, meaning that the actual results of processing of the training data items of the corpus of training data corresponding to a particular device type (i.e., an indication of the device type to which the 2D representation included in the training data corresponds). In other implementations, the training data 1532 may also or alternatively include unlabeled training data.

With the training data 1532 accessed, at step 1506 the training data is divided into training and validation sets. Generally speaking, the items of data in the training set are used to train the untrained DNN 1534 and the items of data in the validation set are used to validate the training of the DNN. As those skilled in the art will appreciate, and as described below in regard to much of the remainder of training process 1500, there are numerous iterations of training and validation that occur during the training of the DNN.

At step 1508 of the training process, the data items of the training set are processed, often in an iterative manner. Processing the data items of the training set includes capturing the processed results. After processing the items of the training set, at step 1510, the aggregated results of processing the training set are evaluated, and at step 1512, a determination is made as to whether a desired accuracy level has been achieved. If the desired accuracy level is not achieved, in step 1514, aspects of the DNN are updated in an effort to guide the DNN to generate more accurate results, and processing returns to step 1506, where a new set of training data is selected, and the process repeats. Alternatively, if the desired accuracy level is achieved, the training process 1500 advances to step 1516.

At step 1516, and much like step 1508, the data items of the validation set are processed, and at step 1518, the processing accuracy of this validation set is aggregated and evaluated. At step 1520, a determination is made as to whether a desired accuracy level, in processing the validation set, has been achieved. If the desired accuracy level is not achieved, in step 1514, aspects of the DNN are updated in an effort to guide the DNN to generate more accurate results, and processing returns to step 1506. Alternatively, if the desired accuracy level is achieved, the training process 1500 advances to step 1522.

At step 1522, a finalized, trained DNN 1553 is generated. Typically, though not exclusively, as part of finalizing the now-trained DNN 1553, portions of the DNN that are included in the model during training for training purposes are extracted, thereby generating a more efficient trained DNN 1553.

In some implementations, the process 1500 may be periodically performed to update training of an existing trained DNN to include in the training newly identified search input-to-result pairs, thereby keeping the trained DNN current.

Figure 16:
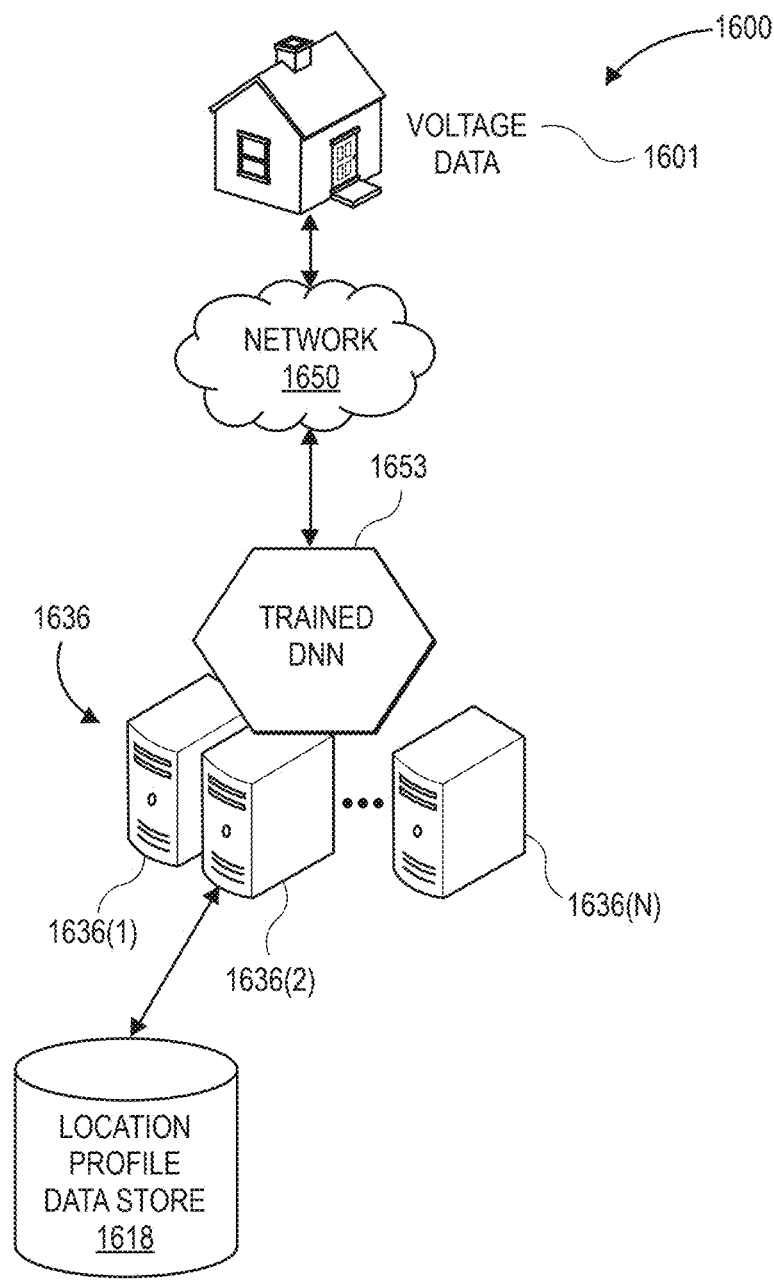
FIG. 16 is a block diagram of an example network configuration that includes a trained deep neural network, in accordance with disclosed implementations.

FIG. 16 is a block diagram of an example network configuration 1600 that includes a trained deep neural network (DNN) 1653, in accordance with disclosed implementations.

As illustrated, the computing resource(s) 1636 may be implemented as one or more servers 1636(1), 1636(2), . . . , 1636(N) and may, in some instances, form a portion of a network-accessible computing platform implemented as a computing infrastructure of processors, storage, software, data access, and so forth that is maintained and accessible by other components/devices/systems via a network 1650, such as an intranet (e.g., local area network), the Internet, etc.

The remote computing resource(s) 1636, and each of the other computing resources discussed herein, do not require end-user knowledge of the physical premises and configuration of the system that delivers the services. Common expressions associated with these remote computing resource(s) 1636 include "on-demand computing," "software as a service (SaaS)," "platform computing," "network-accessible platform," "cloud services," "data centers," and so forth. Example components of a server that may be included in computing resources 1636 is discussed below with respect to FIG. 21.

The network 1650, and each of the other networks discussed herein, may utilize wired technologies (e.g., wires, USB, fiber optic cable, etc.), wireless technologies (e.g., radio frequency, infrared, NFC, cellular, satellite, Bluetooth, etc.), or other connection technologies. The network 1650 is representative of any type of communication network, including data and/or voice network, and may be implemented using wired infrastructure (e.g., cable, CAT6, fiber optic cable, etc.), a wireless infrastructure (e.g., radio frequency, cellular, microwave, satellite, Bluetooth, etc.), and/or other connection technologies.

The remote computing resources 1636 and the trained DNN 1653 executing thereon, may receive, via the network 1650, device signature data 1601 from any of a variety of locations. As noted above, in some implementations, the trained DNN 1653 may be at the location, for example included in the plug-in device, included in a communication device, etc. In other implementations, the DNN may be remote from the location.

In some implementations the trained DNN may be trained to receive as inputs 2D representations of the transient distortions and/or 2D representations of the amplitude distortions, process those inputs, and provide probability scores indicative of a probability score that the received inputs correspond to a device for which the DNN was trained to detect. In some implementations, the DNN may also access a location profile data store 1618 and utilize information from that data store as additional inputs in generating the probability scores.

Figure 17:
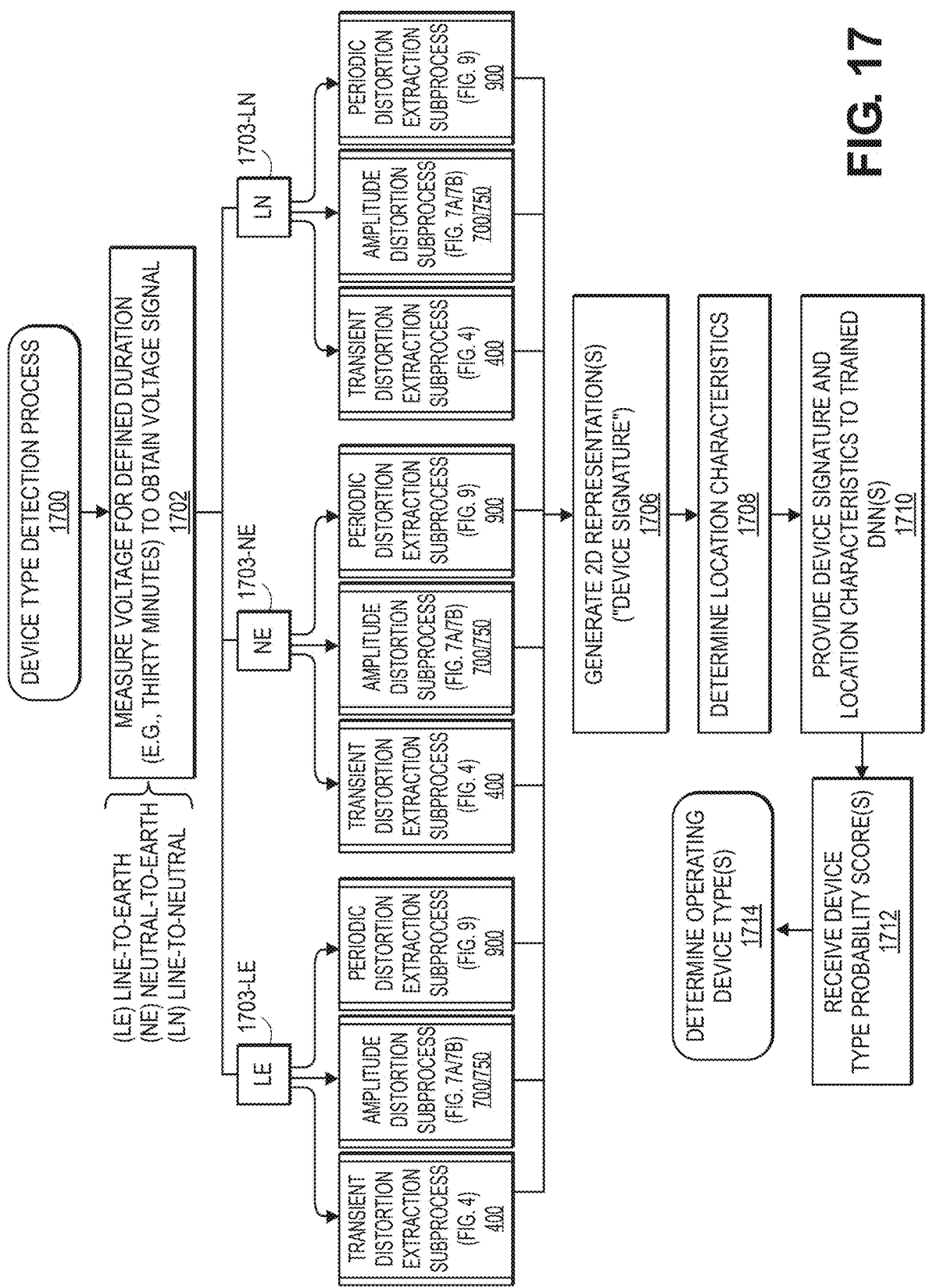
FIG. 17 is an example device type detection process, in accordance with disclosed implementations.

FIG. 17 is an example device type detection process 1700, in accordance with disclosed implementations.

The example process begins by measuring a voltage on an electrical circuit for a defined duration, such as thirty minutes, to obtain a voltage signal, as in 1702. The defined duration may be different for different devices. For example, many devices have a sequencing pattern that is less than thirty minutes. For devices with a sequencing pattern that is longer than thirty minutes, the defined duration may be longer. Likewise, for devices with shorter sequencing patterns, the defined duration may be shorter. In addition, as illustrated, in some implementations, the voltage may be measured across different combinations of wires of the electrical circuit. For example, a first voltage signal having the defined duration may be measured across the line-to-earth ("LE") lines 1703-LE, a second voltage signal may be measured across the neutral-to-earth ("NE") lines 1703-NE, and a third voltage signal may be measured across the line-to-neutral ("LN") lines 1703-LN. In other implementations, the voltage signal may only be measured across the LE lines 1703-LE and the NE lines 1703-NE.

For each measured voltage signal 1703-LE, 1703-NE, and 1703-LN, the voltage signal may be processed using both the transient distortion extraction subprocess 400, as discussed above with respect to FIG. 4, and the amplitude distortion process 700/750, as discussed above with respect to FIGS. 7A and 7B. As discussed, transient distortions may be determined through background subtraction performed on each voltage signal in multiple frequency sub-bands. For example, each voltage signal may be divided into multiple smaller sub-bands, such as 30 Hz, 50 Hz, 60 Hz, etc., and background subtraction performed on each sub-band to determine transient distortions in the voltage signals.

Amplitude distortion may be extracted from the voltage signals with root mean square ("RMS") operations, as discussed above.

The output of each transient distortion extraction subprocess and the output of each amplitude distortion subprocess may be combined to generate a device signature, which may include one or more 2D representations of the transient distortions and the amplitude distortion, as in 1706. In addition, in some implementations, location characteristics may be determined for the location, as in 1708. Location characteristics may include, but are not limited to, occupancy information, time of day, day of week, an operation of a second device type at the location, weather at the location, a device type known to be at the location, a location type of the location, etc. The device signature and any location characteristics may then be provided to one or more trained DNNs, as in 1710, and device type probability scores received from each of those DNNs, each device probability score indicative of a probability that the device signature corresponds to a device for which the DNN was trained, as in 1712. Based on the probability scores, a device type, and optionally an operational state of the device type, may be determined, as in 1714.

Figure 18A:
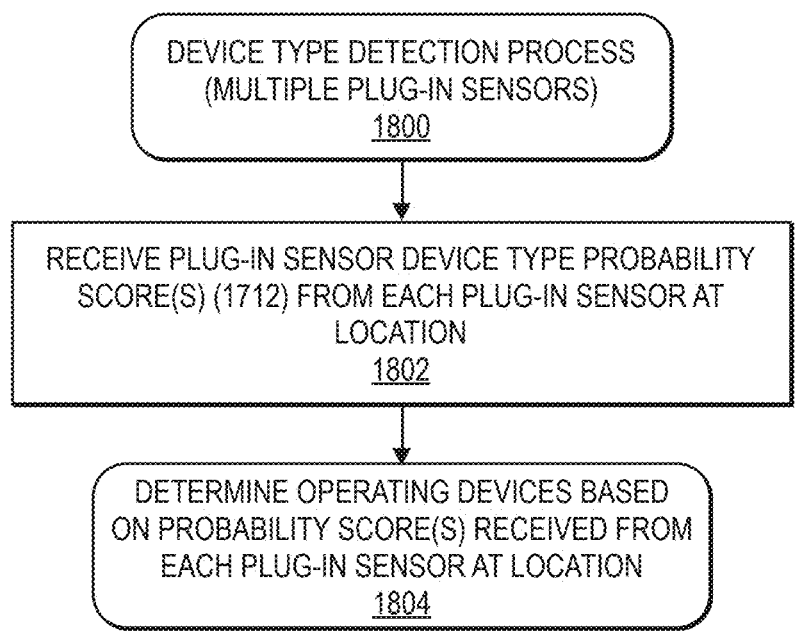
FIGS. 18A and 18B are example device type detection processes that utilize data from multiple plug-in sensors at a location, in accordance with disclosed implementations.

FIG. 18A is an example device type detection process 1800 that utilizes data from multiple plug-in sensors at a location, in accordance with disclosed implementations. The example process 1800 may be performed any time there is more than one plug-in sensor at a location such that data from each of the plug-in sensors at the location can be combined to increase the accuracy of device type determination and/or device operational state determination.

The example process 1800 begins by receiving plug-in sensor device type probability scores(s) determined from each plug-in sensor at a location, as in 1802. Device type probability scores for each plug-in sensor may be determined in accordance with FIG. 17 and in particular with respect to block 1712 of FIG. 17. In such an example, the device type probability scores determined for each plug-in sensor may be independently generated for the respective plug-in sensor.

Based on the device type probability score(s) received for each of the multiple plug-in sensors at the location, one or more operating devices may be determined, as in 1804. For example, the device type probability scores may be combined or compared and a device type with a highest probability score determined as the operating device at the location. Alternatively, the received device type probability scores may be provided to another DNN and the receiving DNN may determine final probability scores for one or more devices indicating the probability that those one or more devices are operating at the location.

Figure 18B:
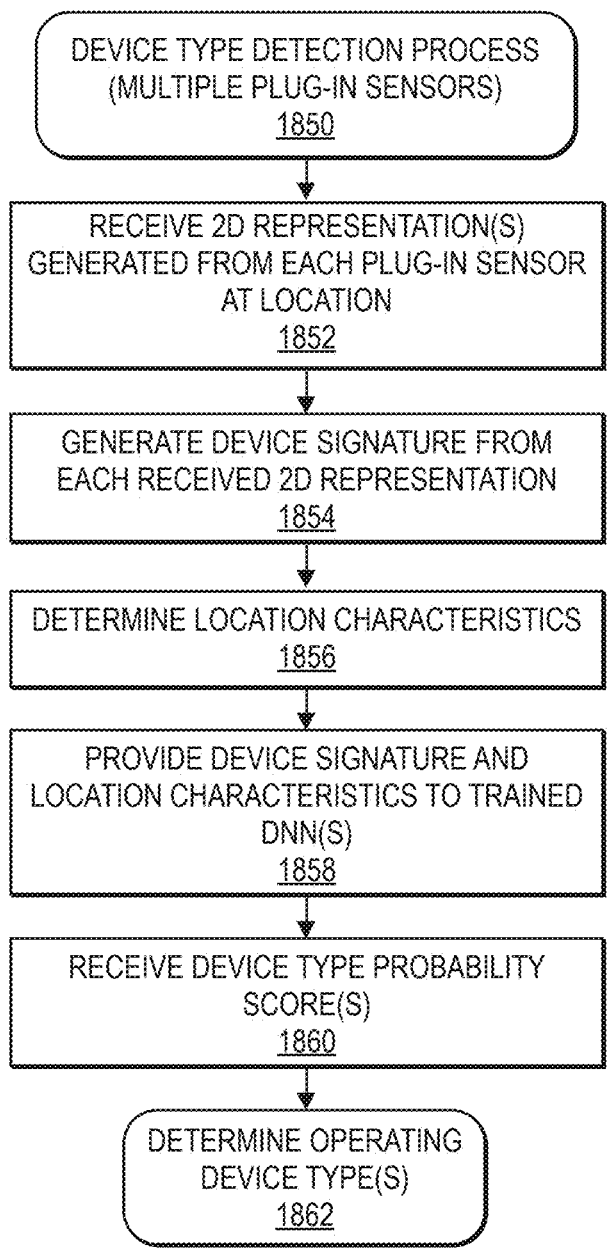

FIG. 18B is another example device type detection process 1850 that utilizes data from multiple plug-in sensors at a location, in accordance with disclosed implementations. The example process 1850 may be performed any time there is more than one plug-in sensor at a location such that data from each of the plug-in sensors at the location can be combined to increase the accuracy of device type determination and/or device operational state determination.

The example process 1850 begins by receiving 2D representations generated from the voltage signature(s) measured at each plug-in sensor at a location, as in 1850. Generation of 2D representations from a voltage signature is discussed above, for example at block 1706 (FIG. 17) and may be performed independently for multiple plug-in sensors at a location.

The example process 1850 may then generate, based on each of the received 2D representations, one or more combined 2D representations as indicative of the device signature, as in 1854. For example, the example process 1850 may combine the 2D representations received from each plug-in sensor into one or more combined 2D representations. For example, first 2D representation(s) of transient distortions, amplitude distortions, and/or periodic distortions determined by a first plug-in sensor may be combined with second 2D representation(s) of transient distortions, amplitude distortions, and/or periodic distortions determined by a second plug-in sensor at the location to form combined 2D representations of transient distortions, amplitude distortions, and/or periodic distortions measured at the location, which are collectively the device signature. In other implementations, the device signature may be all, or some combination of the individual 2D representations received from each of the plug-in sensors at the location.

In addition, in some implementations, location characteristics may be determined for the location, as in 1856. Location characteristics may include, but are not limited to, occupancy information, time of day, day of week, an operation of a second device type at the location, weather at the location, a device type known to be at the location, a location type of the location, etc. The device signature and any location characteristics may then be provided to one or more trained DNNs, as in 1858, and device type probability scores received from each of those DNNs, each device probability score indicative of a probability that the device signature corresponds to a device for which the DNN was trained, as in 1860. Based on the probability scores, a device type, and optionally an operational state of the device type, may be determined, as in 1862.

Figure 19:
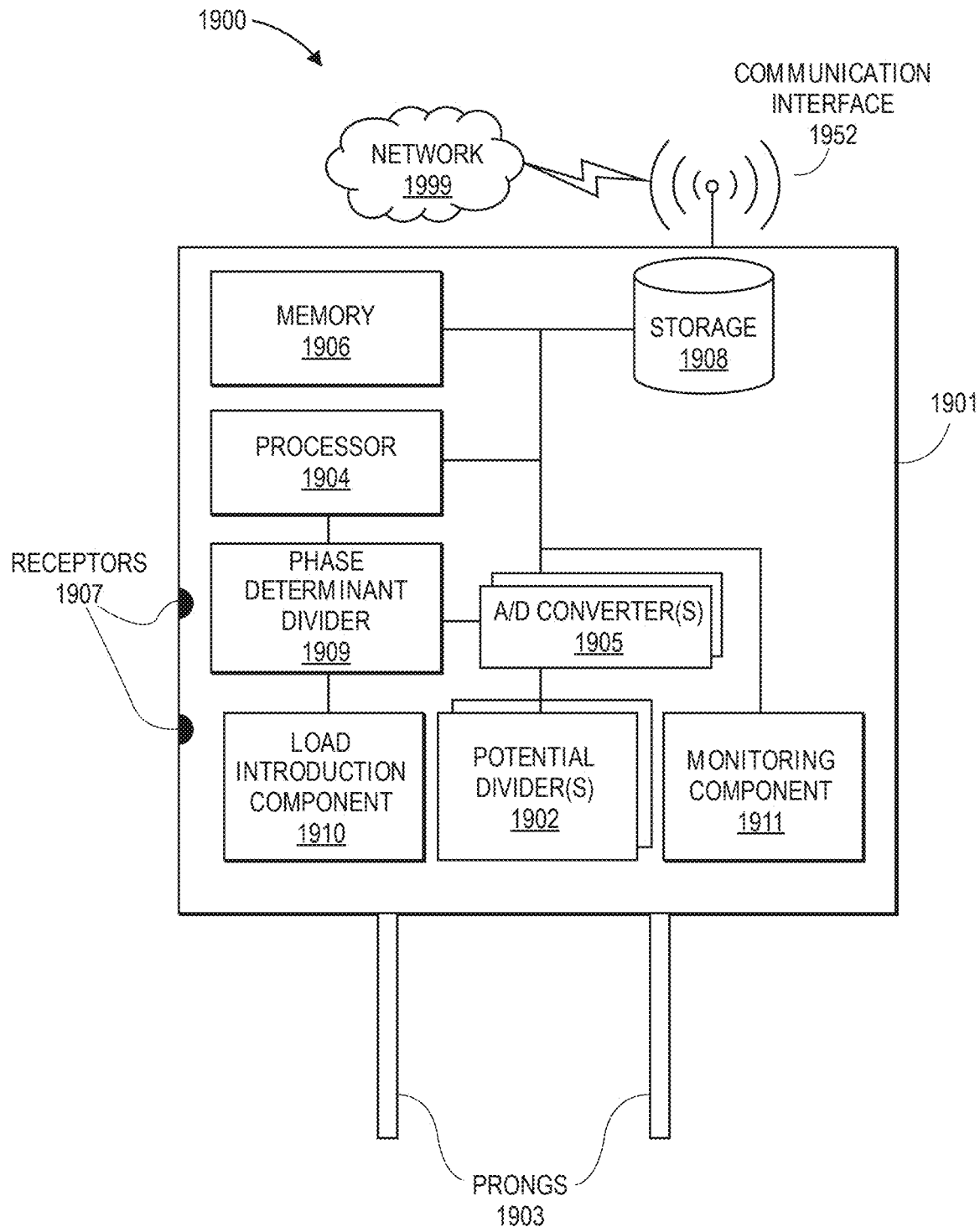
FIG. 19 illustrates example components of a plug-in sensor, in accordance with disclosed implementations.

FIG. 19 illustrates example components of a plug-in sensor 1900, in accordance with disclosed implementations. In implementations, the plug-in sensor 1900 is configured to be installed into an electrical outlet to interact with an electrical circuit at the location. As such, the plug-in sensor will include an insulating housing 1901, such as a plastic body or shell. In some implementations, the housing 1901 will be in the form of a cube such that the plug-in sensor has an appearance of a charger or other common electrical component. Protruding from the housing is at least one prong 1903. In most instances, as illustrated in FIG. 19, there are two prongs 1903 extending from the housing. In some implementations, there may be a third prong, or ground (earth). The prongs interface with the electrical circuit at the location and enable the plug-in sensor to monitor voltage at the location, transmit codes, and/or introduce loads into the circuit at the location. For example, the prongs may be inserted into a common electrical outlet at the location.

Coupled to the prongs 1903 are one or more potential dividers 1902, such as voltage dividers. In some implementations there are three potential dividers, one for voltage measured from the lead line, one for voltage measured from the neutral line, and one for voltage measured from the earth line. In other implementations, there may be additional or fewer potential dividers. The potential dividers 1902 convert a high voltage, such as 120 volts, of the electrical circuit at the location into a lower voltage that can be recorded and analyzed at high frequencies (e.g., 200 kilohertz).

The one or more potential dividers may be coupled to one or more analog-to-digital converters 1905. The analog-to-digital converters receive the high frequency sampling produced by the one or more potential dividers 1902 and convert the analog signal to digital data, referred to herein as voltage data. The voltage data may be stored to memory, such as a random-access memory ("RAM"), flash memory, or other form of permanent or temporary storage 1908. Any form of memory may be used with the disclosed implementations.

The prongs 1903 may also be coupled to a load introduction component 1910, a phase determinant divider 1909, and/or a monitoring component 1911. The load introduction component may be operable to introduce one or more loads into the electrical circuit to which the plug-in sensor is coupled. For example, the load introduction component may be operable to introduce any one or more of a resistive load, an inductive load, or a capacitive load into the electrical circuit. The code transmitter component may be operable to transmit one or more codes that may be detectable by other plug-in sensors and/or communication components at the location to determine if two or more plug-in sensors are on the same phase of the electrical circuit at the location. The phase determinant divider may be configured to determine the phase or current on the electrical circuit to which the plug-in sensor 1900 is connected. Likewise, the monitoring component may be configured to monitor voltage patterns on the electrical circuit and/or detect codes transmitted from other plug-in sensors.

As discussed above, the monitoring component may include components that are configured to measure voltage signals between the lead and earth line, the neutral and earth line, and/or the lead and neutral line. The voltage patterns in the different lines (lead, neutral, earth) may be monitored simultaneously by different components of the monitoring component. Likewise, the monitoring component may be in communication with the processor 1904, the memory 1906, and/or the communication interface 1952.

The memory 1906 stores program instructions that are executable by the one or more processors to cause the one or more processors to perform any one or more portions of the implementations discussed herein. In addition, the memory 1906 and/or the storage 1908 may also maintain a signature data store that includes, for example, signature data of devices known to be at the location and/or device states of devices known to be at the location.

The plug-in sensor 1900 may also include a communication interface 1952, such as a wireless antenna, which enables the plug-in sensor to connect to one or more wireless networks 1999, such as a Wi-Fi network, Bluetooth network, etc., and transmit or receive information, such as detected signature data, voltage data, codes, etc.

In some implementations, the plug-in sensor may also include a pair of electrical prong receptors 1907 that are configured to receive electrical prongs of another device and allow alternating current to passthrough so that the electrical outlet may be utilized by another device, in addition to the plug-in sensor 1900. In still other implementations, the components of the plug-in sensor 1900 may be incorporated entirely into another device, such as a communication component, a communication hub, a device, etc.

Figure 20:
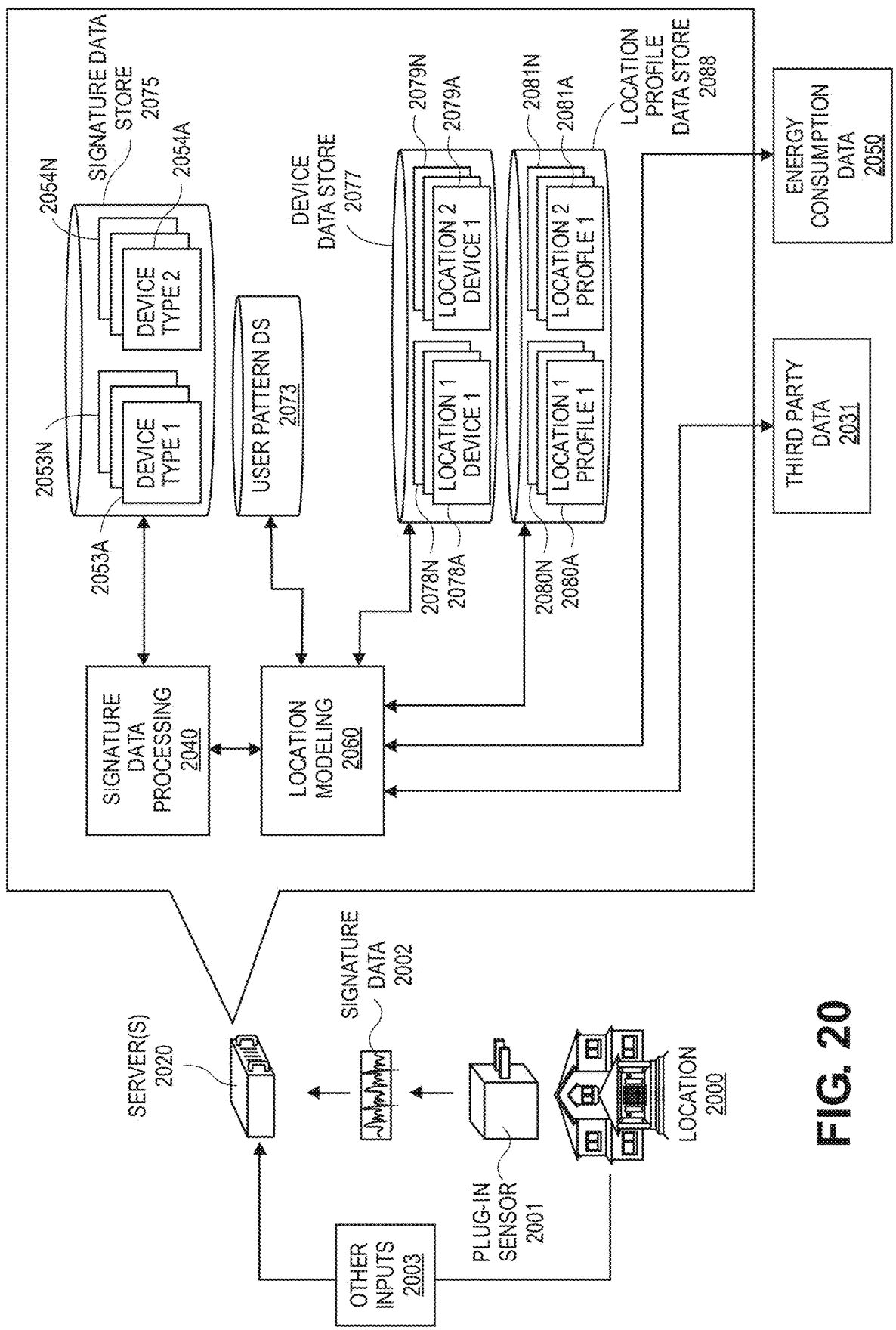
FIG. 20 illustrates example components of a management system, in accordance with disclosed implementations.

FIG. 20 is a conceptual diagram of a server 2020 that processes voltage signature/signature data 2002 and/or other inputs 2003 received from plug-in sensors 2001 at various locations 2000, receives third party data 2031 from third parties. The various components of the server 2020 may be located on the same or different physical devices. Communication between various components illustrated in FIG. 20 may occur directly or across a network. In operation, the server 2020 may include computer-readable and computer-executable instructions that reside on the server 2020 and perform one or more of the described features or functions, also referred to herein as a management system.

Device signature data 2002, or voltage data, from one or more plug-in sensors 2001 at a location 2000 is transmitted in real time, near real time, or periodically to one or more remote computing resources, illustrated in this example as a server 2020. The server receives and processes the signature data 2002 or the voltage data with signature data processing 2040. Processing may include processing the voltage data to determine signature data and/or determining a device type and/or device state that generated the signature data 2002 by comparing through use of the disclosed implementations.

The device types and/or device signature data maintained in the signature data store 2075 may be aggregated from multiple locations as devices at those locations are determined. The aggregated data may then be used to identify devices and/or device states of devices at other locations and, as those devices/device states are identified, the device signature data at those locations are added to the data store. As such, the signature data store 2075 will continue to expand and include device signature data for more devices and/or device states of devices.

In some implementations, rather than voltage data or signature data 2002 being sent from the location 2000 to the servers 2020, the plug-in sensor 2001, a communication hub at the location, or a communication component at the location may process the signature data to determine a device, device type, and/or device state of a device at the location that generated the signature data. A device identifier of the determined device and/or device state, a start time and a stop time corresponding to the signature data, may then be sent to the servers 2020 for additional processing.

As signature data is collected and devices and/or device states determined, the information, including the device and/or device state identifiers, signature data, times of operation, etc., may be aggregated with other signature data generated by other devices at the location 2000 to develop a location profile 2080, that is stored in a location profile data store 2088, using a location modeling component 2060. The location profile 2080 may include device identifiers and/or signature data for devices and/or device states of devices known or determined to be at the location 2000, any operational relationships between devices and/or device states, signature data of those devices and/or device states, predicted times when those devices will be operating in different device states, etc. In addition, in some implementations, the location profile 2080 may also maintain expected and/or actual energy consumption information for detected devices. For example, received third party data 2031 may include expected energy consumption information for different device models. The location modeling component 2060 may also receive energy consumption data 2050 and utilize that information to determine actual energy consumption for devices at the location. As discussed above, the changes in actual energy consumption at different periods of time may be combined with start times and stop times of determined device operation at the location 2000 to determine the amount of energy actually consumed by devices at the location during operation.

As location profiles 2080 are developed for different locations, those profiles may be stored in a location profile data store 2088. In some implementations, different location profiles may be generated for a location based on, for example, the day of the week, the number of people at the location, etc. Over time, multiple location profiles may be created for each location and maintained in the location profile data store 2088. For example, location 1 may include multiple location profiles 2080A-2080N generated at different points in time for that location. Likewise, location 2 may include multiple location profiles 2081A-2081N generated at different points in time for that location. Every location may include one or more location profiles that are stored in the location profile data store 2088. The location profiles, which may be associated with different periods of time during the year, may be used to predict device states and times during which devices are in high demand/high use or low demand/low use.

In some implementations, signature data and/or voltage data may likewise be used to determine user profiles and/or usage patterns corresponding to the location 2000. For example, signature data and/or voltage data may be used to determine the presence or absence of users at the location and/or at particular areas within the location. As users typically follow a patterned behavior, over time, the signature data may be used to determine those user patterns and such information may be stored in the user pattern data store 2073. For example, signature data from device operation of devices at the location may be aggregated over a period of time (e.g., thirty days) to determine that on Monday, Tuesday, Wednesday, Thursday, and Friday, a user at the location generally enters the kitchen within the structure between 05:00 hours and 05:30 hours, moves to a second room between 06:30 hours and 07:30 hours and then departs the location until approximately 18:00 hours. Such information may be maintained in the user profile for the user.

In some implementations, a device data store 2077 may also be maintained. The device data store 2077 may include information regarding devices at each location. For example, the device data store may maintain device information 2078A-2078N for each of multiple different devices at a first location, maintain device information 2079A-2079N for each of multiple different devices at a second location, etc.

Device information may include, among other information, signature data generated by different device states of the device, the manufacturer of the device, the make, model, and year of manufacture, the power rating of the device, the efficiency of the device, etc. In some implementations, data received from a same type of device operating at different locations may be compared to determine consistency among devices and/or to detect potential device problems or abnormalities. For example, if there are fifty microwaves of Brand A and forty-nine of them have similar power demands but the fiftieth one has a higher power demand, it may be determined that the fiftieth microwave is potentially malfunctioning.

Figure 21:
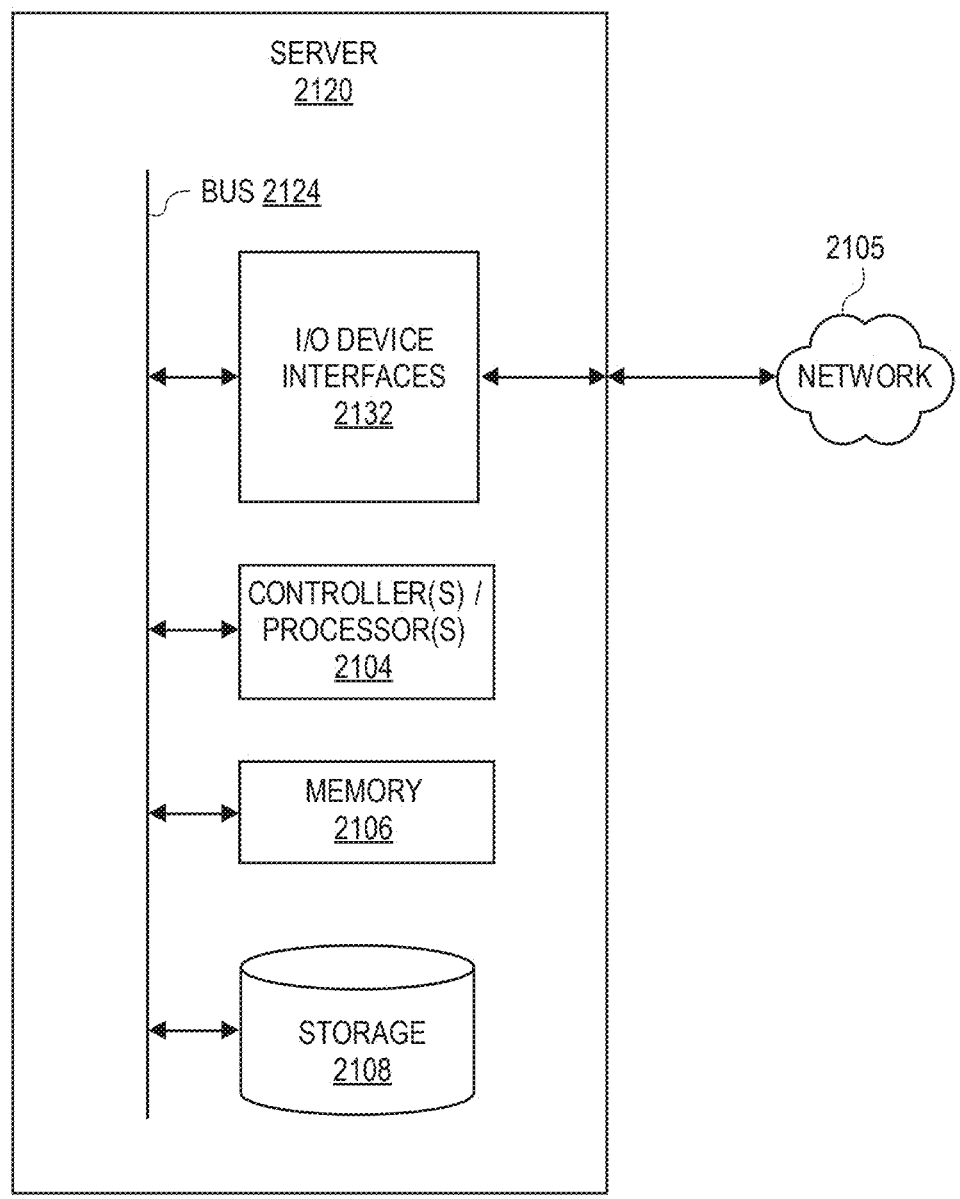
FIG. 21 illustrates example components of a server, in accordance with disclosed implementations.

FIG. 21 is a block diagram conceptually illustrating example components of a remote device, such as a remote server 2120 that may assist with command processing and/or operation of the management system. In operation, the server 2120 may include computer-readable and computer-executable instructions that reside on the server 2120, as will be discussed further below.

The server 2120 may include one or more controllers/processors 2104, that may include a central processing unit (CPU) for processing data and computer-readable instructions, and a memory 2106 for storing data and instructions of the respective device. The memories 2106 may individually include volatile random-access memory (RAM), non-volatile read only memory (ROM), non-volatile magnetoresistive access-memory (MRAM) and/or other types of memory. The server 2120 may also include a data storage component 2108, for storing data and controller/processor-executable instructions. The data storage component 2108 may include one or more non-volatile storage types such as magnetic storage, optical storage, solid-state storage, etc. The server 2120 may also be connected to removable or external non-volatile memory and/or storage (such as a removable memory card, memory key drive, networked storage, etc.) through an input/output device interface 2132.

Computer instructions for operating the server 2120 and its various components may be executed by the controller(s)/processor(s) 2104, using the memory 2106 as temporary "working" storage at runtime. The server's 2120 computer instructions may be stored in a non-transitory manner in non-volatile memory 2106, storage 2108, or an external device(s). Alternatively, some or all of the executable instructions may be embedded in hardware or firmware on the respective device in addition to, or instead of software.

The server 2120 may also include input/output device interfaces 2132. A variety of components may be connected through the input/output device interfaces. Additionally, the server 2120 may include an address/data bus 2124 for conveying data among components of the server 2120. Each component within the server 2120 may also be directly connected to other components in addition to (or instead of) being connected to other components across the bus 2124.

The server 2120 may wirelessly communicate with and receive signature data and/or voltage data from locations and/or provide instructions to devices within the location and/or receive data from the devices. Any form of wired and/or wireless communication may be utilized to facilitate communication between the server 2120, plug-in sensors, communication hubs, communication components, and/or devices. For example, any one or more of 802.15.4 (ZIG-BEE), 802.11 (WI-FI), 802.16 (WiMAX), BLUETOOTH, Z-WAVE, near field communication ("NFC"), etc., may be used to communicate between the server 2120 and one or more plug-in sensors, communication components, communication hubs, and/or devices.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers, communications, energy management, and speech processing should recognize that components and process steps described herein may be interchangeable with other components or steps, or combinations of components or steps, and still achieve the benefits and advantages of the present disclosure. Moreover, it should be apparent to one skilled in the art that the disclosure may be practiced without some, or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage media may be implemented by a volatile computer memory, non-volatile computer memory, hard drive, solid-state memory, flash drive, removable disk and/or other media. In addition, components of one or more of the components and engines may be implemented in firmware or hardware.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly" or "substantially" as used herein, represent a value, amount, or characteristic close to the stated value, amount, or characteristic that still performs a desired function or achieves a desired result. For example, the terms "about," "approximately," "generally," "nearly" or "substantially" may refer to an amount that is within less than 10% of, within less than 5% of, within less than 1% of, within less than 0.1% of, and within less than 0.01% of the stated amount.

Although the invention has been described and illustrated with respect to illustrative implementations thereof, the foregoing and various other additions and omissions may be made therein and thereto without departing from the spirit and scope of the present disclosure.

What is claimed is:

1. A system, comprising:
a first plug-in sensor plugged into a first electrical outlet of an electrical circuit at a location, the first plug-in sensor, including:
   a first housing;
   a first prong inserted into the first electrical outlet;
   a first monitoring component configured to monitor voltage patterns on the electrical circuit; and
   a first communication interface operable to at least transmit first information from the first plug-in sensor; and
a computing system in communication with the first plug-in sensor, the computing system including:
one or more processors; and
a memory storing program instructions that, when executed by the one or more processors, cause the one or more processors to at least:
   receive, from the first plug-in sensor inserted into the first electrical outlet of the electrical circuit, a first voltage signal measured for a defined duration and from the electrical circuit;
   receive, from a second plug-in sensor inserted into a second electrical outlet of the electrical circuit, a second voltage signal measured for the defined duration;
   process the first voltage signal to generate a first two-dimensional ("2D") representation of a transient distortion present on the electrical circuit during the defined duration;
   process the second voltage signal to generate a second 2D representation of the transient distortion; and
   determine, based at least in part on the first 2D representation or the second 2D representation, a device type of a device that produced the transient distortion, wherein the device is different than the first plug-in sensor and the second plug-in sensor.

2. The system of claim 1, wherein the transient distortion occurs on the electrical circuit in response to an operation of the device of the device type.

3. The system of claim 1, wherein the program instructions that cause the one or more processors to process the first voltage signal to generate the first 2D representation, further include program instructions that, when executed by the one or more processors, further cause the one or more processors to at least:
   background subtract, from the first voltage signal, a periodic signal to produce a background subtracted signal; and
   produce, based at least in part on the background subtracted signal, the first 2D representation.

4. The system of claim 1,
wherein the program instructions that, when executed by the one or more processors, further cause the one or more processors to at least:
   provide to at least one deep neural network ("DNN") at least one of the first 2D representation or the second 2D representation; and wherein the program instructions that cause the one or more processors to determine the device type of the device, further include program instructions that, when executed by the one or more processors, further cause the one or more processors to at least:
    determine, based at least in part on a response received from the at least one DNN, the device type of the device that produced the transient distortion.

5. The system of claim 1,
wherein the program instructions that, when executed by the one or more processors, further cause the one or more processors to at least:
    provide the first 2D representation to a first deep neural network ("DNN"); and
    provide the second 2D representation to a second DNN; and
wherein the program instructions that cause one or more processors to determine the device type of the device, further include program instructions that, when executed by the one or more processors, further cause the one or more processors to at least:
    determine, based at least in part on a first response received from the first DNN and based at least in part on a second response received from the second DNN, the device type of the device that produced the transient distortion.

6. The system of claim 1, wherein the program instructions that, when executed by the one or more processors, further cause the one or more processors to at least:
    combine the first 2D representation and the second 2D representation to produce a
    combined 2D representation; and
    wherein the program instructions that cause the one or more processors to determine the device type of the device, further include program instructions that, when executed by the one or more processors, further cause the one or more processors to at least:
        determine the device type of the device based at least in part on the combined 2D representation.

7. The system of claim 1, wherein the program instructions that cause the one or more processors to process the first voltage signal to generate the first 2D representation, further include program instructions that, when executed by the one or more processors, further cause the one or more processors to at least:
    convert the first voltage signal into a Cepstral domain;
    extract a plurality of lower Cepstral coefficients from a spectral envelope of the Cepstral domain; and
    generate the first 2D representation based at least in part on the plurality of lower Cepstral coefficients.

8. The system of claim 1, wherein the program instructions that, when executed by the one or more processors, further cause the one or more processors to at least:
    generate, based at least in part on the first voltage signal, a third 2D representation of an amplitude distortion; and
    wherein the program instructions that cause the one or more processors to determine the device type of the device, further include program instructions that, when executed by the one or more processors, further cause the one or more processors to at least:
        determine the device type of the device based at least in part on the first 2D representation and the third 2D representation.

9. The system of claim 1, wherein the program instructions that cause the one or more processors to determine the device type of the device, further include program instructions that, when executed by the one or more processors, further cause the one or more processors to at least:
    determine the device type of the device based at least in part on the first 2D representation or the second 2D representation and supplemental information corresponding to the location of the electrical circuit, wherein the supplemental information indicates at least one of an occupancy at the location, a time of a day, a day of a week, an operation of a second device type at the location, a weather at the location, a device type known to be at the location, or a location type of the location.

10. The system of claim 1, wherein the computing system is included in a communication hub at the location.

11. The system of claim 8, wherein the program instructions that, when executed by the one or more processors, further cause the one or more processors to at least:
    compute, for each of a plurality of segments of the first voltage signal, a root mean square; and
    wherein the program instructions that cause the one or more processors to generate the third 2D representation, further include program instructions that cause the one or more processors to at least:
        generate the third 2D representation based at least in part on the root mean square computed for each of the plurality of segments.

12. A system, comprising:
    a plug-in sensor plugged into an electrical outlet of an electrical circuit at a location, the plug-in sensor, including:
        a housing;
        at least one prong inserted into the electrical outlet;
        a monitoring component configured to monitor voltage patterns on the electrical circuit; and
        a communication interface operable to at least transmit information from the plug-in sensor; and
    a computing system, including:
        one or more processors; and
        a memory storing program instructions that, when executed by the one or more processors, cause the one or more processors to at least:
            receive, from the plug-in sensor, a first voltage signal measured for a defined duration and from the electrical circuit;
            process the first voltage signal to generate a first two-dimensional ("2D") representation of a transient distortion present on the electrical circuit during the defined duration; and
            determine, based at least in part the first 2D representation, a device type of a device that produced the transient distortion, wherein the device is different than the plug-in sensor.

13. The system of claim 12,
wherein the program instructions that, when executed by the one or more processors, further cause the one or more processors to at least:
    receive, from a second plug-in sensor inserted into a second electrical outlet of the electrical circuit, a second voltage signal measured for the defined duration; and
    process the second voltage signal to generate a second 2D representation of the transient distortion; and
    wherein the program instructions that cause the one or more processors to determine the device type of the device, further include program instructions that, when executed by the one or more processors, further cause the one or more processors to at least:

determine the device type of the device based at least in part on the first 2D representation and the second 2D representation.

14. The system of claim 12,
wherein the program instructions that, when executed by the one or more processors, further cause the one or more processors to at least:
receive, from a second plug-in sensor inserted into a second electrical outlet of the electrical circuit, a second voltage signal measured for the defined duration;
process the second voltage signal to generate a second 2D representation of the transient distortion; and
combine the first 2D representation and the second 2D representation to produce a combined 2D representation; and
wherein the program instructions that cause the one or more processors to determine the device type of the device, further include program instructions that, when executed by the one or more processors, further cause the one or more processors to at least
determine, based at least in part on the combined 2D representation, the device type of the device.

15. The system of claim 12, wherein the program instructions that cause the one or more processors to process the first voltage signal, further include program instructions that, when executed by the one or more processors, further cause the one or more processors to at least:
background subtract, from the first voltage signal, a periodic signal to produce a background subtracted signal; and
produce, based at least in part on the background subtracted signal, the first 2D representation.

16. The system of claim 12, wherein the program instructions that cause the one or more processors to process the first voltage signal, further include program instructions that, when executed by the one or more processors, further cause the one or more processors to at least:
convert the first voltage signal into a Cepstral domain;
extract a plurality of lower Cepstral coefficients from a spectral envelope of the Cepstral domain; and
generate the first 2D representation based at least in part on the plurality of lower Cepstral coefficients.

17. The system of claim 13, wherein the program instructions that cause the one or more processors to determine the device type, further include instructions that, when executed by the one or more processors, further cause the one or more processors to at least:
provide the first 2D representation to a first deep neural network ("DNN");
provide the second 2D representation to a second DNN; and
determine, based at least in part on a first response from the first DNN and based at least in part on a second response from the second DNN, the device type of the device that produced the transient distortion.

18. A system, comprising:
a plug-in sensor plugged into an electrical outlet of an electrical circuit at a location, the plug-in sensor, including:
a housing;
at least one prong inserted into the electrical outlet;
a monitoring component configured to monitor voltage patterns on the electrical circuit; and
a communication interface operable to at least transmit information from the plug-in sensor; and
a computing system in communication with the plug-in sensor, the computing system configured to perform a method, comprising:
receiving, from the plug-in sensor inserted into the electrical outlet of the electrical circuit, a first voltage signal measured for a defined duration and from the electrical circuit;
processing the first voltage signal to generate a first two-dimensional ("2D") representation of a transient distortion present on the electrical circuit during the defined duration;
providing, to a deep neural network ("DNN"), the first 2D representation; and
determining, based at least in part on a response received from the DNN, a device type of a device that produced the transient distortion, wherein the device is different than the plug-in sensor.

19. The system of claim 18, wherein the method performed by the computing system further includes:
generating, based at least in part on the first voltage signal, a second 2D representation of an amplitude distortion; and
providing, to the DNN, the first 2D representation and the second 2D representation; and
wherein the response received from the DNN is based at least in part on the first 2D representation and the second 2D representation.

20. The system of claim 19, wherein the method performed by the computing system further includes:
computing, for each of a plurality of segments of the first voltage signal, a root mean square; and
wherein the second 2D representation is based at least in part on the root mean square computed for each of the plurality of segments.

* * * * *